(12) United States Patent
Hiramatsu et al.

(10) Patent No.: US 6,878,907 B2
(45) Date of Patent: Apr. 12, 2005

(54) CERAMIC SUBSTRATE AND PROCESS FOR PRODUCING THE SAME

(75) Inventors: Yasuji Hiramatsu, Gifu (JP); Yasutaka Ito, Gifu (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

(21) Appl. No.: 10/277,818

(22) Filed: Oct. 23, 2002

(65) Prior Publication Data

US 2003/0042245 A1 Mar. 6, 2003

Related U.S. Application Data

(62) Division of application No. 09/869,594, filed as application No. PCT/JP00/03080 on May 15, 2000.

(30) Foreign Application Priority Data

Feb. 25, 2000 (JP) ........................ 2000-049482

(51) Int. Cl.$^7$ ................................ H05B 3/68
(52) U.S. Cl. .................... 219/444.1; 219/544
(58) Field of Search .............. 219/444.1, 460.1, 219/461.1, 465.1, 466.1, 467.1, 468.1, 543, 544, 546, 547, 548; 338/304, 308, 314; 118/724, 725

(56) References Cited

U.S. PATENT DOCUMENTS

| | | | |
|---|---|---|---|
| 3,067,610 A | 12/1962 | Walz et al. | |
| 4,034,207 A | 7/1977 | Tamada et al. | |
| 4,443,691 A | 4/1984 | Sauer | |
| 5,068,517 A | 11/1991 | Tsuyuki et al. | |
| 5,072,236 A | 12/1991 | Tatsumi et al. | |
| 5,908,799 A | * 6/1999 | Kobayashi et al. | ........ 501/98.4 |
| 6,080,970 A | 6/2000 | Yoshida et al. | |
| 6,107,638 A | * 8/2000 | Sumino et al. | ................ 257/43 |
| 6,133,557 A | 10/2000 | Kawanabe et al. | |
| 6,448,538 B1 | * 9/2002 | Miyata | ..................... 219/444.1 |
| 6,465,763 B1 | 10/2002 | Ito et al. | |
| 6,475,606 B2 | 11/2002 | Niwa | |
| 6,507,006 B1 | * 1/2003 | Hiramatsu et al. | ........ 219/444.1 |

FOREIGN PATENT DOCUMENTS

| | | |
|---|---|---|
| JP | 62-167396 | 10/1987 |
| JP | 2292058 | 12/1990 |
| JP | 3222761 | 10/1991 |
| JP | 6-52974 | 2/1994 |
| JP | 8019982 | 1/1996 |
| JP | 2513995 | 7/1996 |
| JP | 8-273814 | 10/1996 |
| JP | 9-180867 | 7/1997 |
| JP | 2798570 | 9/1998 |
| JP | 11-74064 | 3/1999 |
| JP | 11339939 | 12/1999 |
| JP | 2000-12194 | 1/2000 |

OTHER PUBLICATIONS

U.S. Appl. No. 10/277,818, filed Oct. 23, 2002, Hiramatsu et al.
U.S. Appl. No. 10/658,454, filed Sep. 10, 1993, Ito et al.

(Continued)

*Primary Examiner*—S. Paik
(74) *Attorney, Agent, or Firm*—Oblon, Spivak, McClelland, Maier & Neustadt, P.C.

(57) ABSTRACT

It is a an object of the present invention to provide a ceramic substrate for a semiconductor producing/examining device which has high fracture toughness value, exellent thermal shock resistivity, high thermal conductivity and an excellent temperature rising and falling properties, and is preferable as a hot plate, an electrostatic chuck, a wafer prober and the like. A ceramic substrate, for a semiconductor producing/examining device, having a conductor formed inside thereof or on the surface thereof of the present invention is the ceramic substrate, wherein said ceramic substrate has been sintered such that a fractured section thereof exhibits intergranular fracture.

15 Claims, 8 Drawing Sheets

OTHER PUBLICATIONS

U.S. Appl. No. 09/673,953, filed Dec. 21, 2000, Ito et al.
U.S. Appl. No. 09/806,477, filed Jun. 25, 2001, Ito et al.
U.S. Appl. No. 10/346,095, filed Jan. 17, 2003, Ito et al.
U.S. Appl. No. 10/663,681, filed Sep. 17, 2003, Ito et al.
U.S. Appl. No. 10/048,490, filed Apr. 30, 2002, Ito et al.
U.S. Appl. No. 09/524,010, filed Mar. 13, 2000, Niwa.
U.S. Appl. No. 09/946,463, filed Sep. 6, 2001, Niwa.
U.S. Appl. No. 10/244,008, filed Sep. 16, 2002, Niwa.
U.S. Appl. No. 10/670,354, filed Sep. 26, 2003, Niwa.
U.S. Appl. No. 10/168,527, filed Jun. 28, 2002, Hiramatsu et al.
U.S. Appl. No. 09/926,465, filed Feb. 12, 2002, Furukawa et al.
U.S. Appl. No. 09/831,887, filed May 23, 2001, Ito et al.
U.S. Appl. No. 10/387,452, filed Mar. 14, 2003, Ito et al.
U.S. Appl. No. 10/372,296, filed Dec. 11, 2003, Ito et al.
U.S. Appl. No. 09/807,960, filed May 18, 2001, Hiramatsu et al.
U.S. Appl. No. 10/229,177, filed Aug. 28, 2002, Hiramatsu et al.
U.S. Appl. No. 10/049,293, filed Apr. 30, 2002, Ito et al.
U.S. Appl. No. 10/118,967, filed Apr. 10, 2002, Ito et al.
U.S. Appl. No. 10/226,160, filed Aug. 23, 2002, Ito et al.
U.S. Appl. No. 09/806,478, filed Jul. 26, 2001, Ito et al.
U.S. Appl. No. 09/926,092, filed Dec. 27, 2001, Ito et al.
U.S. Appl. No. 10/618,651, filed Jul. 15, 2003, Ito et al.
U.S. Appl. No. 10/618,623, filed Jul. 15, 2003, Ito et al.
U.S. Appl. No. 10/618,655, filed Jul. 15, 2003, Ito et al.
U.S. Appl. No. 10/618,665, filed Jul. 15, 2003, Ito et al.
U.S. Appl. No. 09/869,321, filed Oct. 18, 2001, Zhou.
U.S. Appl. No. 09/926,012, filed Oct. 24, 2001, Hiramatsu et al.
U.S. Appl. No. 10/352,138, filed Jan. 28, 2003, Hiramatsu et al.
U.S. Appl. No. 10/260,360, filed Oct. 1, 2002, Niwa.
U.S. Appl. No. 09/926,297, filed Dec. 26, 2001, Hiramatsu et al.
U.S. Appl. No. 10/746,081, filed Dec. 29, 2003, Hiramatsu et al.
U.S. Appl. No. 09/926,296, filed Dec. 27, 2001, Ito et al.
U.S. Appl. No. 09/926,362, filed Jan. 16, 2002, Hiramatsu et al.
U.S. Appl. No. 10/442,967, filed May 22, 2003, Hiramatsu et al.
U.S. Appl. No. 09/926,464, filed Jan. 10, 2002, Hiramatsu et al.
U.S. Appl. No. 09/926,499, filed Mar. 26, 2002, Hiramatsu et al.
U.S. Appl. No. 10/386,615, filed Mar. 13, 2003, Hiramatsu et al.
U.S. Appl. No. 10/088,100, filed Jun. 26, 2002, Ido.
U.S. Appl. No. 09/926,714, filed Dec. 6,, 2001, Ito et al.
U.S. Appl. No. 10/009,174, filed Apr. 21, 2003, Hiramatsu et al.
U.S. Appl. No. 09/926,713, filed Mar. 5, 2002, Hiramatsu et al.
U.S. Appl. No. 10/619,567, filed Jul. 16, 2003, Hiramatsu et al.
U.S. Appl. No. 09/926/800, filed Mar. 19, 2002, Hiramatsu et al.
U.S. Appl. No. 10/615,950, filed Jul. 10, 2003, Hiramatsu et al.
U.S. Appl. No. 10/311,368, filed Dec. 16, 2002, Ito et al.
U.S. Appl. No. 10/416,497, filed May 19, 2003, Hiramatsu et al.
U.S. Appl. No. 10/019,280, filed Apr. 22, 2002, Ito et al.
U.S. Appl. No. 10/967,287, filed Oct. 31, 2003, Ito et al.
U.S. Appl. No. 10/019,448, filed Apr. 8, 2002, Ito et al.
U.S. Appl. No. 10/019,444, filed Apr. 23, 2002, Hiramatsu et al.
U.S. Appl. No. 10/019,311, filed Apr. 9, 2002, Hiramatsu et al.
U.S. Appl. No. 10/397,321, filed Mar. 27, 2003, Hiramatsu et al.
U.S. Appl. No. 10/030,123 filed May 16, 2002, Hiramatsu et al.
U.S. Appl. No. 10/718,535, filed Nov. 24, 2003, Hiramatsu et al.
U.S. Appl. No. 10/343,747, filed Feb. 6, 2003, Ito et al.
U.S. Appl. No. 10/048,979, filed Apr. 26, 2003, Hiramatsu et al.
U.S. Appl. No. 10/048,989, filed May 29, 2002, Hiramatsu et al.
U.S. Appl. No. 10/069,511, filed Jun.24, 2002, Ito et al.
U.S. Appl. No. 10/069,510, filed Jun. 20, 2002, Hiramatsu et al.
U.S. Appl. No. 10/070,443, filed Jun. 24, 2002, Hiramatsu et al.
U.S. Appl. No. 10/070,441, filed Jun. 26, 2002, Ito et al.
U.S. Appl. No. 10/088,098, filed May 30, 2002, Ito et al.
U.S. Appl. No. 10/362,941, filed Apr. 28, 2003, Ito et al.
U.S. Appl. No. 10/111,980, filed Apr. 30, 2002, Ito et al.
U.S. Appl. No. 10/181,724, Jul. 22, 2002, Hiramatsu et al.
U.S. Appl. No. 10/343,833, Feb. 10, 2003, Zhou et al.
U.S. Appl. No. 10/344,148, filed Feb. 10, 2003, Kariya, et al.
U.S. Appl. No. 10/398,393, filed Apr. 7, 2003, Hiramatsu et al.
U.S. Appl. No. 10/473,585, filed Oct. 9, 2003, Ito.
U.S. Appl. No. 10/363,310, filed Mar. 3, 2003, Ito.
U.S. Appl. No. 10/432,639, filed Jun. 10, 2003, Ito et al.
U.S. Appl. No. 09/462,067, filed Jan. 5, 2001, Furukawa, et al.
U.S. Appl. No. 09/471,759, filed Dec. 23, 1999, Saito et al.
U.S. Appl. No. 09/787,816, filed Mar. 23, 2001, Ito.
U.S. Appl. No. 09/917,749, filed Jul. 31, 2001, Ito.
U.S. Appl. No. 09/787,954, filed Mar. 23, 2001, Ito.
U.S. Appl. No. 10/345,356, filed Jan. 16, 2003, Ito.
U.S. Appl. No. 09/787,818, filed Mar. 23, 2001, Ito.
U.S. Appl. No. 09/915,418, filed Jul. 27, 2001, Ito.
U.S. Appl. No. 10/356,519, filed Feb. 3, 2003, Ito.
U.S. Appl. No. 10/217,029, filed Aug. 13, 2002, Ito.
U.S. Appl. No. 09/979,676, filed Nov. 5, 2001, Zhou.
U.S. Appl. No. 10/049,539, filed Nov. 7, 2001, Zhou.
U.S. Appl. No. 10/048,894, filed Feb. 1, 2002, Furukawa.
U.S. Appl. No. 09/806,957, filed Apr. 6, 2001, Ito et al.
U.S. Appl. No. 09/890,358, filed Jul. 30, 2001, Ito.
U.S. Appl. No. 09/916,682, filed Jul. 30, 2001, Ito.
U.S. Appl. No. 10/222,928, filed Aug. 19, 2002, Ito.
U.S. Appl. No. 10/182,009, filed Jul. 24, 2002, Zhou.
U.S. Appl. No. 09/958,689, filed Oct. 10, 2001, Furukawa et al.
U.S. Appl. No. 09/926,730, filed Apr. 16, 2001, Hiramatsu et al.
U.S. Appl. No. 10/265,413, filed Oct. 7, 2002, Ohashi et al.
U.S. Appl. No. 09/880,742, filed Jun. 13, 2001, Saito et al.
U.S. Appl. No. 09/880,359, filed Jun. 13, 2001, Saito et al.
U.S. Appl. No. 09/880,379, filed Jun. 13, 2001, Saito et al.
U.S. Appl. No. 10/759,083, filed Jan. 20, 2004, Hiramatsu et al.

* cited by examiner

CERAMIC SUBSTRATE AND PROCESS FOR PRODUCING THE SAME

TECHNICAL FIELD

The present invention relates to a ceramic substrate used mainly in the semiconductor industry, and particularly to a ceramic substrate that is suitable for a hot plate, an electrostatic chuck, a wafer prober and the like, and is superior in thermal shock resistance, heat uniformity, chuck power and so on.

BACKGROUND ART

Semiconductors are very important goods necessary in various industries. A semiconductor chip is produced, for example, by slicing a silicon monocrystal into a predetermined thickness to produce a silicon wafer, and then forming a plurality of integrated circuits and the like on this silicon wafer.

In the process for producing this semiconductor chip, a silicon wafer put on an electrostatic chuck is subjected to various treatments such as etching and CVD to form a conductor circuit, an element and the like. At this time, corrosive gas such as gas for deposition or gas for etching is used; therefore, it is necessary to protect an electrostatic electrode layer from corrosion by these gas. Since it is also necessary to induce adsorption power, the electrostatic electrode layer is usually coated with a ceramic dielectric film and the like.

As this ceramic substrate, Japanese Patent gazette No. 279850 and Japanese Patent gazette No. 2513995, JP Kokai Hei 11-74064 and so on describe electrostatic chucks with a heater which is produced through the process of stacking the green sheets, on which paste of a metal such as tungsten (W) is printed.

SUMMARY OF THE INVENTION

However, in ceramic substrates produced by such a process, problems as follows arise: cracks start to be generated at edges of their conductor layer such as a resistance heating element when thermal shock is given to the substrates; or a high temperature area is generated along the resistance heating element.

Furthermore, a scatter is generated in chuck power so that sufficient adsorption power cannot be obtained.

About an internal electrode or a resistance heating element, a leakage current between the electrodes or between the resistance heating elements at high temperature comes into a problem.

The inventors made eager investigations to solve the above-mentioned problems. As a result, the inventors have newly found out that these problems can be solved by making the edge of a cross section of conductor layer constituting an electrostatic electrode, an RF electrode and a resistance heating element into a peaked shape. Thus, the present invention has been made.

Namely, the present invention is a ceramic substrate comprising a conductor layer formed therein, characterized in that a section of the edge of the conductor layer is in a peaked shape.

In the case that the above-mentioned conductor layer in the ceramic substrate of the present invention is a resistance heating element, the present invention functions as a hot plate.

In the case that the above-mentioned conductor layer is an electrostatic electrode, the present invention functions as an electrostatic chuck.

In the ceramic substrate, the conductor layer desirably has a portion in the peaked-shape having a width of 0.1 to 200 μm.

The process for producing a ceramic substrate of the present invention is characterized by printing a conductor layer on a ceramic green sheet, integrating the green sheet with another green sheet under heating and pressure, and then sintering the ceramic powder.

Figure 1:
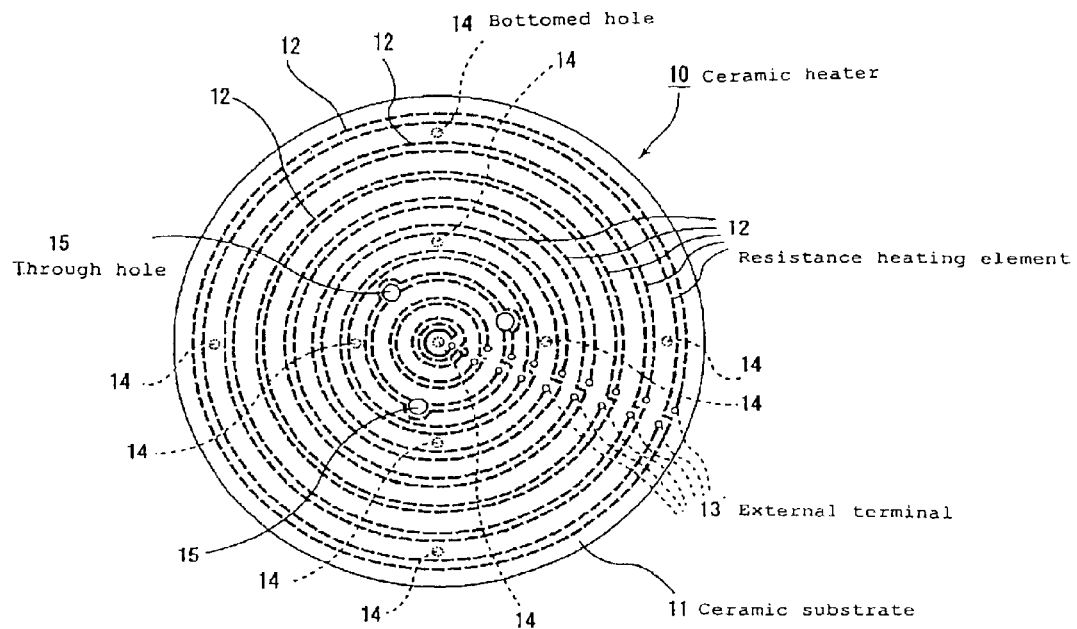
FIG. 1 is a plain view that schematically illustrates one example of a ceramic heater using a ceramic substrate of the present invention.

EXPLANATION OF SYMBOLS 1, 11, 63 ceramic substrate
2, 22, 32a, 32b chuck positive electrode electrostatic layer
3, 23, 33a, 33b chuck negative electrode electrostatic layer
2a, 3a semicircular part
2b, 3b comb-teeth-shaped part
4 ceramic dielectric film
5, 12, 25, 61 resistance heating element 6, 13, 18 external terminal
7 metal line
8 Peltier device
9 silicon wafer
10 ceramic heater
14 bottomed hole
15 through hole
16, 17, 18 plated through hole
20, 30, 101, 201, 301, 401 electrostatic chuck
25a metal covering layer
35, 36 blind hole
41 supporting case
42 coolant outlet
43 inhalation duct
44 coolant inlet
45 heat insulator
62 chuck top conductor layer
65 guard electrode
66 ground electrode
66a non-electrode forming area
67 groove
68 suction hole
501 wafer prober

DETAILED DISCLOSURE OF THE INVENTION

The present invention is a ceramic substrate comprising a conductor layer formed therein,
characterized in that a section of the edge of the conductor layer is in a peaked shape.

In the case that the conductor layer in the above-mentioned ceramic substrate is a resistance heating element, the present invention functions as a hot plate. In the case that the conductor layer is an electrostatic electrode, the present invention functions as an electrostatic chuck.

The ceramic substrate of the present invention is desirably used at 150° C. or higher, and is most desirably used at 200° C. or higher.

In the ceramic substrate, the conductor layer desirably has a portion in the peaked shape having a width of 0.1 to 200 μm, and more desirably has the peaked portion having a width of 5 to 100 μm.

In the process for producing the above-mentioned ceramic substrate, the following process is desirably adopted: a process of printing a conductor layer on a ceramic green sheet, integrating the green sheet with another green sheet under heating and pressure, and then sintering the ceramic powder.

In the case that the conductor layer embedded in the ceramic substrate used in the present invention is an electrode for inducing chuck power of an electrostatic chuck, that is, an electrostatic electrode, the edges of the electrode is in a peaked shape so that an electric field concentrates along the edge. Thus, large chuck power is considered to be induced.

The reason why cracks are generated by thermal shock is analyzed. A conductor layer produced by a conventional printing process and the like has a substantially rectangular section and, therefore, has a face perpendicular to a wafer processing surface (a surface for heating, supporting or adsorbing a semiconductor wafer). Moreover, the thermal expansion coefficient of the conductor layer is different from that of the ceramic constituting the ceramic substrate. Therefore, if the ceramic substrate is heated or cooled, power for separating the face perpendicular to the wafer processing surface of the conductor layer from the ceramic around the face is produced. This power would cause generation of cracks easily.

However, in the ceramic substrate of the present invention, its conductor layer has no face perpendicular to the wafer processing surface. As a result, cracks are not easily generated.

The reason why a high-temperature area is generated along the resistance heating element would be that heat is easily accumulated in the following portion inside the resistance heating element: the line intersection portion between the face perpendicular to the wafer processing surface and the face horizontal to the wafer processing surface. The reason why such a heat-accumulating phenomenon is caused is unclear. It is however presumed that heats are emitted and transmitted from both of the face perpendicular to the wafer processing surface and the face horizontal to the wafer processing surface so that these heats cross each other in the line intersection portion.

However, the ceramic substrate of the present invention has no face perpendicular to the wafer processing surface. Therefore, such a heat accumulating phenomenon is not caused so that heat uniformity of the wafer processing surface is superior.

Furthermore, in the case that the ceramic substrate has therein a conductor layer such as an electrode (a guard electrode and a ground electrode of a wafer prober an electrode of an electrostatic chuck, an RF electrode and the like) or a resistance heating element, the faces perpendicular to the wafer processing surface of the conductor layer, if exist, confront each other. Thus, a leakage current is easily generated at high temperature. In the present invention, a section of the edge of the conductor is in a peaked shape. No faces confront each other. Thus, a leakage current is not easily generated at high temperature.

The ceramic substrate of the present invention is used in the range of 150° C. or higher, and preferably in the range of 200° C. or higher.

The conductor layer of the present invention may be an electrostatic electrode, a resistance heating element, an RF electrode and also may be a guard electrode or a ground electrode used in a wafer prober.

The conductor layer desirably has the peaked shape portion having a width of 0.1 to 200 μm. If the width of the peaked shape portion is over 200 μm, its ohmic resistance value is scattered. On the other hand, if the width is below 0.1 μm, the effect of preventing cracks is not caused. The width of the peaked shape portion is optimally from 5 to 100 μm. The curvature radius of the peaked shape portion is optimally from 0.5 to 500 μm.

In the ceramic substrate of the present invention, the pore diameter of the maximum pore is desirably 50 μm or less. The porosity thereof is desirably 5% or less. It is also desirable that no pores are present or, if present, the pore diameter of the maximum pore is 50 μm or less.

If no pores are present, breakdown voltage is especially high at high temperature. Conversely, if pores are present, fracture toughness becomes high. Thus, which is designed depends on required properties.

The reason why fracture toughness becomes high on the basis of the presence of pores is unclear, but it is presumed that the reason is based on stop of development of cracks by the pores.

The reason why the pore diameter of the maximum pore is desirably 50 μm or less in the present invention is that if the pore diameter is over 50 μm, it is difficult to keep breakdown voltage property at high temperature and particularly at 200° C. or higher.

The pore diameter of the maximum pore is desirably 10 μm or less. This is because the amount of warp becomes small at 200° C. or higher.

The porosity and the pore diameter of the maximum pore are adjusted by press time, pressure and temperature at the time of sintering, or additives such as SiC and BN. Since SiC or BN hinders sintering, pores can be produced.

When the pore diameter of the maximum pore is measured, 5 samples are prepared. The surfaces thereof are polished into mirror planes. With an electron microscope, ten points on the surface are photographed with 2000 to 5000 magnifications. The maximum pore diameter is selected from the photos obtained by the photographing, and the average of the 50 shoots is defined as the pore diameter of the maximum pore.

The porosity is measured by Archimedes' method. This is a method of crushing a sintered product to pieces, putting the pieces into an organic solvent or mercury to measure the volume thereof, obtain the true specific gravity of the pieces from the weight and the volume thereof, and calculating the porosity from the true specific gravity and apparent specific gravity.

The diameter of the ceramic substrate of the present invention is desirably 200 mm or more. It is especially desirable that the diameter is 12 inches (300 mm) or more. This is because semiconductor wafers having such a diameter become main currents of the next-generation semiconductor wafers.

The thickness of the ceramic substrate of the present invention is desirably 50 mm or less, and especially desirably 25 mm or less.

If the thickness of the ceramic substrate is over 25 mm, the thermal capacity of the ceramic substrate is too large. Particularly when a temperature control means is set up to heat or cool the substrate, temperature-following property may become poor because of the large thermal capacity.

The thickness of the ceramic substrate is optimally 5 mm or less. Incidentally the thickness of the ceramic substrate is desirably 1 mm or more.

The ceramic material constituting the ceramic substrate of the present invention is not especially limited. Examples thereof include nitride ceramics, carbide ceramics, and oxide ceramics.

Examples of the nitride ceramics include metal nitride ceramics such as aluminum nitride, silicon nitride and boron nitride.

Examples of the carbide ceramics include metal carbide ceramics such as silicon carbide, zirconium carbide, tantalum carbide, and tungsten carbide.

Examples of the oxide ceramics include metal oxide ceramics such as alumina, zirconia, cordierite and mullite.

These ceramics may be used alone or in combination of two or more thereof.

Among these ceramics, the nitride ceramics and oxide ceramics are preferred.

Aluminum nitride is most preferred among nitride ceramics since its thermal conductivity is highest, that is, 180 W/m·K.

The ceramic substrate preferably contains 0.1 to 5% by weight of oxygen. In this case, for example, the sintering of the nitride ceramic advances easily. Thus, even if the nitride ceramic contains pores, the pores are independently of each other so that the breakdown voltage is improved.

If the content is below 0.1% by weight, the breakdown voltage cannot be kept. Contrarily, if the content is over 5% by weight, the breakdown voltage property at high temperature of oxides becomes poor so that the breakdown voltage drops as well. If the oxygen content is over 5% by weight, the thermal conductivity drops so that temperature-rising and temperature-fall property becomes poor.

In order to incorporate oxygen into, for example, the nitride ceramic, it is general that the nitride ceramic powder is fired in an oxidizing atmosphere or that a metal oxide is mixed with ingredient powder of the nitride ceramic and then the mixture is sintered. In the case of the oxide ceramic, another oxide is mixed with it to make a complex oxide.

Examples of the metal oxide include yttria ($Y_2O_3$), alumina ($Al_2O_3$), rubidium oxide ($Rb_2O$), lithium oxide (Li2O) and calcium oxide ($CaCO_3$).

The content by percentage of these metal oxides is preferably from 0.1 to 20% by weight.

In the present invention, the ceramic substrate preferably contains 5 to 5000 ppm of carbon.

The ceramic substrate can be blackened by incorporating carbon. Thus, when the substrate is used as a heater, radiant heat can be sufficiently used.

Carbon may be amorphous or crystalline. When amorphous carbon is used, a drop in the volume resistivity at high temperature can be prevented. When crystalline carbon is used, a drop in the thermal conductivity at high temperature can be prevented. Therefore, crystalline carbon and amorphous carbon may be used together dependently on use. The carbon content is preferably from 50 to 2000 ppm.

When carbon is incorporated into the ceramic carbon, carbon is preferably incorporated in the manner that its brightness will be below N4 as a value based on the rule of JIS Z 8721. The ceramic having such a brightness is superior in radiant heat capacity and covering property.

The brightness N is defined as follows: the brightness of ideal black is made to 0; that of ideal white is made to 10; respective colors are divided into 10 parts in the manner that the brightness of the respective colors is recognized stepwise between the brightness of black and that of white; and the resultant parts are indicated by symbols N0 through N10, respectively.

Actual brightness is measured by comparison with color signals corresponding to N0 through N10. One place of decimals in this case is made to 0 or 5.

The ceramic substrate of the present invention is a ceramic substrate used in a device for producing a semiconductor or examining a semiconductor. Examples of specific devices include an electrostatic chuck, a hot plate (ceramic heater) and a wafer prober.

In the case that the conductor formed inside the ceramic substrate is a resistance heating element, the ceramic substrate can be used as a ceramic heater (hot plate).

Figure 2:
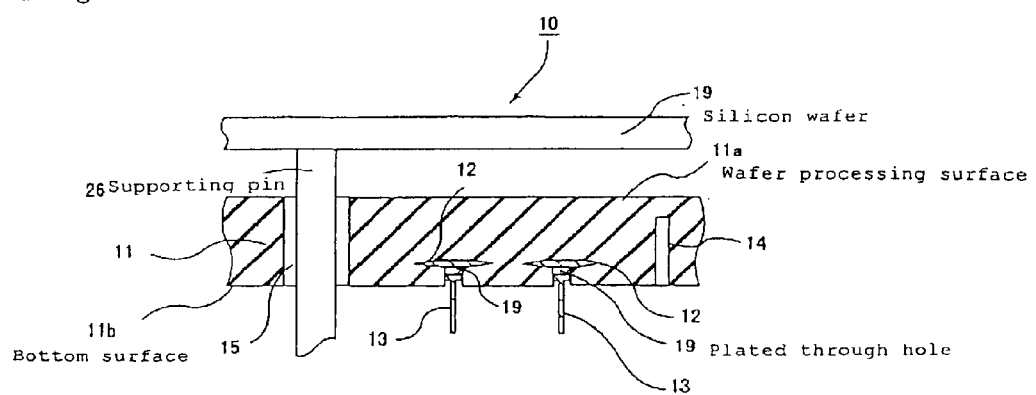
FIG. 2 is a partially enlarged sectional view of the ceramic heater illustrated in FIG. 1.

FIG. 1 is a plain view that schematically shows an example of a ceramic heater that is one embodiment of the ceramic substrate of the present invention. FIG. 2 is a partially enlarged section showing a part of the ceramic heater shown in FIG. 1.

A ceramic substrate 11 is made in a disk form. Inside the ceramic substrate 11, resistance heating elements 12 as temperature control means are formed in the pattern of concentric circles. About these resistor heating elements 12, two concentric circles near to each other are connected to produce one line as a circuit, and external terminals 13 that become inputting/outputting terminal pins are connected to both ends of the circuit via plated through holes 19. As shown in FIG. 2, sections of both edges of the resistance heating element 12 are in a peaked shape. Therefore, cracks based on thermal shock and the like are not easily generated in the ceramic substrate 11, and a heat-accumulating phenomenon is not generated in the edge of the resistance heating elements 12, either. Moreover, distribution of temperature in the wafer processing surface is not caused so that the temperature of the face becomes uniform.

As shown in FIG. 2, through holes 15 are made in the ceramic substrate 11, and support pins 26 are inserted into the through holes 15 to support a silicon wafer 9. By moving the support pins 26 up and down, it is possible to receive the silicon wafer 9 from a carrier machine, put the silicon wafer 9 on a wafer processing surface 11a of the ceramic substrate 11 and heat the wafer 9, or support the silicon wafer 9 in the state that the wafer 9 is apart from the wafer processing surface 11a at an distance of about 50 to 2000 $\mu$m and then heat the wafer 9. Bottomed holes 14 into which temperature-measuring elements such as thermocouples are fitted are made in a bottom surface 11a of the ceramic substrate 11. When an electric current is passed through the resistance heating elements 12, the ceramic substrate 11 is heated so that a product to be heated, such as a silicon wafer, can be uniformly heated.

In the case of a ceramic heater, the resistance heating elements whose edge has a peaked-shape section are set inside the ceramic substrate. In this manner, the resistance heating elements have the advantages of the present invention. In the case of an electrostatic chuck or wafer prober that will be described later, the resistance heating elements may be set on the bottom surface of the ceramic substrate. In this case, a section of the edge of an electrostatic electrode, a guard electrode, a ground electrode and so on is made into a peaked shape. In this manner, these electrodes have the above-mentioned advantageous effects of the present invention.

In the case that the resistance heating elements are set inside the ceramic substrate, an coolant outlet for a coolant such as air as a cooling means may be made in a supporting case into which the ceramic substrate is fitted. In the case that the resistance heating elements are set inside the ceramic substrate, each of the resistance heating elements may be made of a plurality of layers. In this case, the patterns of the respective layers may be formed to complement them mutually. A pattern is desirably formed on any one of the layers when being viewed from the heating surface. For example, a structure having a staggered arrangement is desirable.

The resistance heating element is desirably made of a metal such as a noble metal (gold, silver, platinum and palladium), lead, tungsten, molybdenum, nickel; and a conductive ceramics such as tungsten carbide and molybdenum carbide. These can make the ohmic resistance value high and make the thickness itself large to prevent the element-disconnection and the like, and are not easily oxidized. Their thermal conductivity is not easily lowered, either. These may be used alone or in combination of two or more.

Since it is necessary that the temperature of the whole of the ceramic substrate is made uniform, the resistance heating element preferably has a pattern of concentric circles shown in FIG. 1, or a combination of a pattern of concentric circles and that of bent lines. The thickness of the resistance heating element is desirably from 1 to 50 $\mu$m, and the width thereof is preferably from 5 to 20 mm. The resistance heating element desirably has the peaked shape portion having a width of 0.1 to 200 $\mu$m.

By changing the thickness or the width of the resistance heating element, its ohmic resistance value can be changed; however, the above-mentioned ranges are most practical. As the resistance heating element becomes thinner or narrower, the ohmic resistance value of the resistance heating element becomes larger.

If the resistance heating element is set inside, the distance between a heating surface and the resistance heating element becomes close so that uniformity of the temperature of the surface becomes poor. Thus, it is necessary to widen the width of the resistance heating element itself. Since the resistance heating element is set inside the ceramic substrate, it is unnecessary to consider adhesiveness of this element to the ceramic substrate.

A section of the resistance heating element may be rectangular, elliptic, spindle-shaped, or semicylindrical. The section is desirably flat. A section of the edge of the resistance heating element is desirably in a peaked shape. This is because; if the section is flat, heat is easier to be radiated toward the heating surface, so that the amount of heat transmitted to the heating surface can be made large. Thus, temperature distribution in the heating surface is not easily formed. The shape of the resistance heating element may be spiral.

When the resistance heating elements are formed inside the ceramic substrate, the resistance heating elements are desirably formed within the domain extending from the bottom of the substrate up to 60% of the thickness thereof. This is because the temperature distribution in the heating surface is removed so that a semiconductor wafer can be uniformly heated.

A thing to be heated, such as a semiconductor wafer, can be directly put on the heating surface and then heated. The product may be kept about 50 to 200 $\mu$m apart from the heating surface and then heated.

In order to form the resistance heating elements on the bottom surface of the ceramic substrate for semiconductor devices of the present invention, or inside the ceramic substrate, it is preferred to use a conductor containing paste comprising a metal or a conductive ceramic.

Namely, in the case that the resistance heating elements are formed on the bottom surface of the ceramic substrate, sintering is usually performed to produce the ceramic substrate and then a layer of the conductor containing paste is formed on the surface of the ceramic substrate and sintered to produce the resistance heating elements.

On the other hand, in the case that the resistance heating elements 12 are formed inside the ceramic substrate 12 as shown in FIGS. 1 and 2, a layer of the conductor containing paste is formed on a green sheet and then the green sheet is integrated with another green sheet under heating and pressure to produce a lamination of the green sheets. At this time, the conductor containing paste layer having the edge in a peaked shape can be formed by heating the lamination up to a temperature at which the conductor containing paste after drying is liable to deform to some extent. Thereafter, the lamination is sintered to make the resistance heating elements whose edge has a section in a peaked shape inside the ceramic substrate.

The conductor containing paste is not limited. Preferably, the conductor containing paste contains a resin, a solvent, a thickener and so on, as well as metal particles or conductive ceramic particles to ensure conductivity.

The material of the metal particles or the conductive ceramic particles may be the above-mentioned ones. The particle diameter of the metal particles or the conductive ceramic particles is preferably from 0.1 to 100 $\mu$m. If the diameter is too fine, that is, below 0.1 $\mu$m, these particles are easily oxidized. On the other hand, if the diameter is over 100 $\mu$m, these particles are not easily sintered so that the ohmic resistance value becomes large.

The shape of the metal particles may be spherical or scaly. In the case that these metal particles are used, a mixture of spherical particles and scaly particles can be used.

The case that the above-mentioned metal particles are scaly, or are a mixture of spherical and scaly particles is profitable since metal oxides are easily kept between the metal particles so that the adhesion between the resistance heating elements and ceramic substrate is made sure and the ohmic resistance value can be made large.

Examples of the resin used in the conductor containing paste include acrylic resins, epoxy resins, and phenol resins. An example of the solvent is isopropyl alcohol and the like. An example of the thickener is cellulose and the like.

When the conductor containing paste for the resistance heating elements is formed on the surface of the ceramic substrate, it is preferred to add not only the metal particles but also a metal oxide to the conductor containing paste and sinter the metal particles and the metal oxide. By sintering the metal oxide together with the metal particles as described above, the ceramic substrate still more adhered to the metal particles can be obtained.

The reason why the adhesiveness of the metal particles to the ceramic substrate is improved by the mixing of the metal oxide is unclear, but would be as follows: the surface of the metal particles or the surface of the ceramic substrate comprising non-oxides is slightly oxidized to form oxidized films; and the oxidized films are sintered and integrated with each other through the metal oxide, so that the metal particles are closely adhered to the ceramic. In the case that the ceramic constituting the ceramic substrate is an oxide, the surface thereof is naturally made of the oxide. Therefore, the conductor layer superior in adhesiveness is formed.

Preferred examples of the above-mentioned oxide may be at least one selected from the group consisting of lead oxide, zinc oxide, silica, boron oxide ($B_2O_3$), alumina, yttria and titania.

These oxides can improve the adhesiveness between the metal particles and the ceramic substrate without increasing the ohmic resistance value of the resistance heating element.

When the total amount of the metal oxides is made to 100 parts by weight, the weight ratio of lead oxide, zinc oxide, silica, boron oxide ($B_2O_3$), alumina, yttria and titania is as follows: lead oxide: 1 to 10, silica: 1 to 30, boron oxide: 5 to 50, zinc oxide: 20 to 70, alumina: 1 to 10, yttria: 1 to 50 and titania: 1 to 50, and the ratio preferably being adjusted within the scope that the total thereof is not over 100 parts by weight.

By adjusting the amounts of these oxides within these ranges, the adhesiveness to the ceramic substrate can be particularly improved.

The addition amount of the metal oxides to the metal particles is preferably from 0.1% by weight (including 0.1%) to 10% by weight (not including 10%). The area resistivity when the conductor containing paste having such a structure is used to form the resistance heating element is preferably from 1 to 45 m$\Omega$/□.

If the area resistivity is over 45 m$\Omega$/□, the calorific value to an applied voltage becomes too large so that, in the ceramic substrate for semiconductor devices wherein resistance heating elements are set on its surface, its calorific value is not easily controlled. If the addition amount of the metal oxides is 10% or more by weight, the area resistivity exceeds 50 m$\Omega$/□ so that the calorific value becomes too large. Thus, temperature-control is not easily performed so that the uniformity in temperature distribution becomes poor.

In the case that the resistance heating elements are formed on the surface of the ceramic substrate, a metal covering layer is preferably formed on the surfaces of the resistance heating elements. The metal covering layer prevents a change in the ohmic resistance value resulting from the oxidization of the inner metal sintered product. The thickness of the formed metal covering layer is preferably from 0.1 to 10 $\mu$m.

The metal used for forming the metal covering layer is not particularly limited provided that the metal is a metal which is hardly oxidized. Specific examples thereof include gold, silver, palladium, platinum, and nickel. These may be used alone or in combination of two or more. Among these metals, nickel is preferred.

In the case that the resistance heating elements are formed inside the ceramic substrate, no covering is necessary since the surfaces of the resistance heating elements are not oxidized.

In the case that the conductor formed inside the ceramic substrate is an electrostatic electrode layer, the ceramic substrate can be used as an electrostatic chuck. In this case, an RF electrode and resistance heating elements may be formed as conductors below the electrostatic electrode and inside the ceramic substrate.

Figure 3:
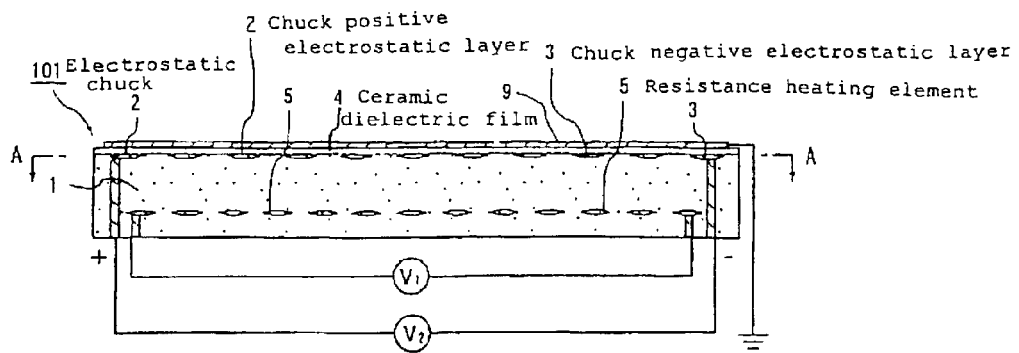
FIG. 3 is a sectional view that schematically illustrates one example of an electrostatic chuck using a ceramic substrate of the present invention.
Figure 4:
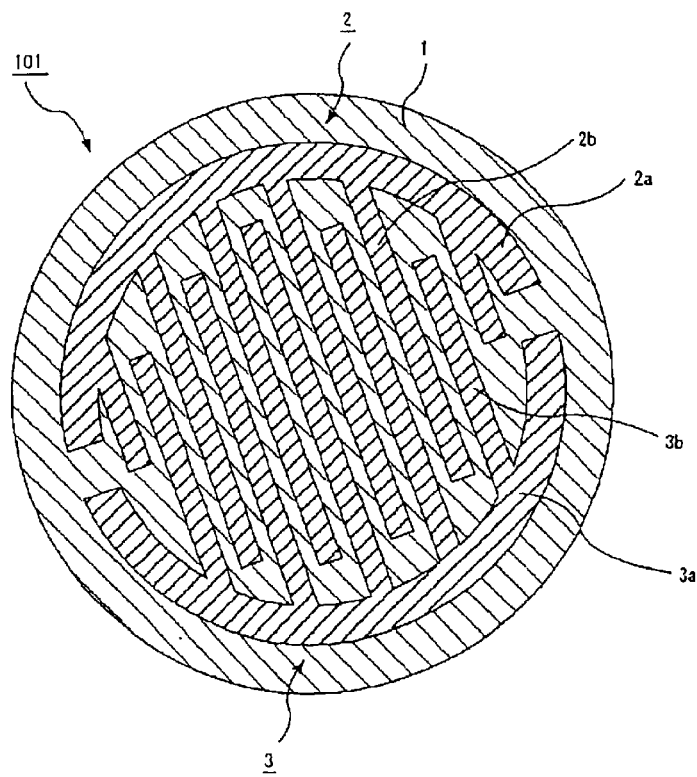
FIG. 4 is a sectional view taken along A—A line of the ceramic heater illustrated in FIG. 3.

FIG. 3 is a vertical sectional view that schematically shows one embodiment of an electrostatic chuck according to the present invention. FIG. 4 is a sectional view taken on A—A line of the electrostatic chuck shown in FIG. 3.

In this electrostatic chuck 101, an electrostatic electrode layer composed of a chuck positive electrostatic layer 2 and a chuck negative electrostatic layer 3 is buried in a disk-shaped ceramic substrate 1. A thin ceramic layer 4 (hereinafter referred to as a ceramic dielectric film) is made on the electrostatic electrode layer. A silicon wafer 9 is put on the electrostatic chuck 101 and is earthed.

As shown in FIG. 4, the chuck positive electrostatic layer 2 is composed of a semicircular part 2a and a comb-teeth-shaped part 2b. The chuck negative electrostatic layer 3 is also composed of a semicircular part 3a and a comb-teeth-shaped part 3b. These chuck positive electrostatic layer 2 and chuck negative electrostatic layer 3 are arranged by facing each other so that the comb-teeth-shaped parts 2b and 3b cross each other. The positive side and the negative side of a direct power source are connected to the chuck positive electrostatic layer 2 and chuck negative electrostatic layer 3, respectively. Thus, a direct current $V_2$ is applied thereto.

As shown in FIG. 3, a section of the edges of the resistance heating elements 5, and a section of the edge of the semicircular parts 2a and 3a and the comb-teeth-shaped parts 2b and 3b, which constitute the chuck positive electrostatic layer 2 and the chuck negative electrostatic layer 3, respectively, are in a peaked shape.

In order to control the temperature of the silicon wafer 9, resistance heating elements 5 in the form of concentric circles as viewed from the above, as shown in FIG. 1, are set up inside the ceramic substrate 1. External terminals are connected and fixed to both ends of the resistance heating elements 5, and a voltage $V_1$ is applied thereto. A bottomed hole into which a temperature-measuring element is inserted and a through hole through which a support pin (not illustrated) that supports the silicon wafer 9 and moves it up and down penetrates are made in the ceramic substrate 1, as shown in FIGS. 1 and 2 but not shown in FIGS. 3 and 4. The resistance heating elements may be formed on the bottom surface of the ceramic substrate.

When this electrostatic chuck 101 is caused to work, a direct voltage $V_2$ is applied to the chuck positive electrostatic layer 2 and the chuck negative electrostatic layer 3. In this way, the silicon wafer 9 is adsorbed and fixed onto the chuck positive electrostatic layer 2 and the chuck negative electrostatic layer 3 through the ceramic dielectric film 4 by electrostatic action of these electrodes. The silicon wafer 9 is fixed onto the electrostatic chuck 101 in this way, and subsequently the silicon wafer 9 is subjected to various treatments such as CVD.

In the electrostatic chuck 101 according to the present invention, the section of the edge of the chuck positive and negative electrostatic layers 2 and 3 is in a peaked shape; therefore, an electric field concentrates along the edge so that a large chuck power is induced. Since the section of the edge of the chuck positive and negative electrostatic layers 2 and 3 and the resistance heating elements 5 is in a peaked shape, cracks are not easily generated and no heat-accumulating phenomenon is generated in the edge of the resistance heating elements 5.

In the electrostatic chuck 101, the ceramic dielectric film 4 is made of a nitride ceramic containing oxygen, and desirably has a porosity of 5% or less and a maximum pore diameter of 50 µm or less. The pores in this ceramic dielectric film 4 are desirably composed of pores independent of each other.

In the ceramic dielectric film 4 having such a structure, it does not happen that gas and so on which will lower the breakdown voltage penetrate through the ceramic dielectric film to corrode the electrostatic electrodes. Moreover, the breakdown voltage of the ceramic dielectric film does not drop even at high temperature.

Besides the resistance heating elements 12, a Peltier device (see FIG. 7) is mentioned as the temperature control means.

In the case that the Peltier device is used as the temperature control element, both heating and cooling can be attained by changing the direction along which an electric current passes. Thus, this case is advantageous.

Figure 7:
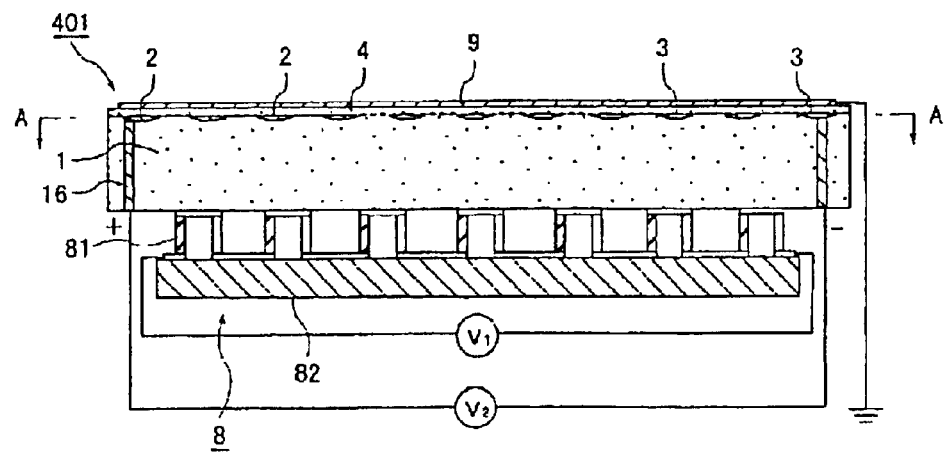
FIG. 7 is a sectional view that schematically illustrates one example of an electrostatic chuck using a ceramic substrate of the present invention.

As shown in FIG. 7, the Peltier device 8 is formed by connecting p type and n type thermoelectric elements 81 in series and then jointing the resultant to a ceramic plate 82 and the like.

Examples of the Peltier device include silicon/germanium, bismuth/antimony, and lead/tellurium materials and the like.

The electrostatic chuck of the present invention has a structure as shown in, for example, FIGS. 3 and 4. The raw materials of the ceramic substrate and so on have already been described. The following will describe other respective members constituting the electrostatic chuck, and other embodiments of the electrostatic chuck of the present invention in detail and successively.

The material of the ceramic dielectric film constituting the electrostatic chuck of the present invention is not particularly limited. Examples thereof include oxide ceramics, nitride ceramics and oxide ceramics and the like. Among these, nitride ceramics are preferred.

As this nitride ceramic, the same as materials of the above-mentioned ceramic substrate can be listed up. The nitride ceramic desirably contains oxygen. In this case, the sintering of the nitride ceramic advances easily. In the case that the nitride ceramic substrate includes pores, the pores are formed to be independent of each other so that the breakdown voltage is improved.

In order to incorporate oxygen into the nitride ceramic, a metal oxide is usually mixed with ingredient powder of the nitride ceramic, and then the mixture is sintered.

The metal oxide may be alumina ($Al_2O_3$), silicon oxide ($SiO_2$), and the like.

The addition amount of such a metal oxide is preferably from 0.1 to 10 parts by weight per 100 parts by weight of the nitride ceramic.

By setting the thickness of the ceramic dielectric film to 50 to 5000 µm, sufficient breakdown voltage can be kept without lowering chucking power.

If the thickness of the ceramic dielectric film is less than 50 µm, the thickness is too thin to obtain sufficient breakdown voltage. Thus, when a silicon wafer is put and adsorbed thereon, the ceramic dielectric film may undergo dielectric breakdown. On the other hand, if the thickness of the ceramic dielectric film is over 5000 µm, the distance between the silicon wafer and the electrostatic electrodes is large so that the capability of adsorbing the silicon wafer is lowered. The thickness of the ceramic dielectric film is preferably from 100 to 1500 µm.

Preferably, the porosity of the ceramic dielectric film is 5% or less and the pore diameter of maximum pores is 50 µm or less.

If the porosity is over 5%, the number of the pores increases and the diameter of the pores becomes too large so that the pores are easily connected to each other. In ceramic dielectric films having such a structure, their breakdown voltage drops.

When the pore diameter of the maximum pores is over 50 µm, breakdown voltage cannot be kept at high temperature even if oxides are present at boundaries between the grains. The porosity is preferably from 0.01 to 3%. The diameter of the maximum pores is preferably from 0.1 to 10 µm.

The ceramic dielectric film desirably contains 50 to 5000 ppm of carbon. This is because carbon can hide the electrode pattern arranged in the electrostatic chuck and give high radiant heat. As the volume resistivity is lower, the adsorption power of the silicon wafer becomes higher at low temperatures.

The reason why pores may be present to some extent in the ceramic dielectric film in the present invention is that fracture toughness can be made high. In this way, thermal shock resistance can be improved.

The electrostatic electrode may be, for example, a sintered product made of a metal or a conductive ceramic, or a metal foil. As the metal sintered product, a product made of at least one selected from tungsten and molybdenum is preferable. The metal foil is preferably made of the same as the raw material of the metal sintered product as well. This is because these metals are not relatively liable to be oxidized and have sufficient conductivity for electrodes. In this case, the edge of the metal foil is heated and pressed, or is made into a peaked shape by chemical or physical etching. Examples of the chemical etching include etching with an acidic or alkaline solution. Examples of the physical etching include ion beam etching, and plasma etching. As the conductive ceramic, there may be used at least one selected from carbides of tungsten and molybdenum.

Figure 9:
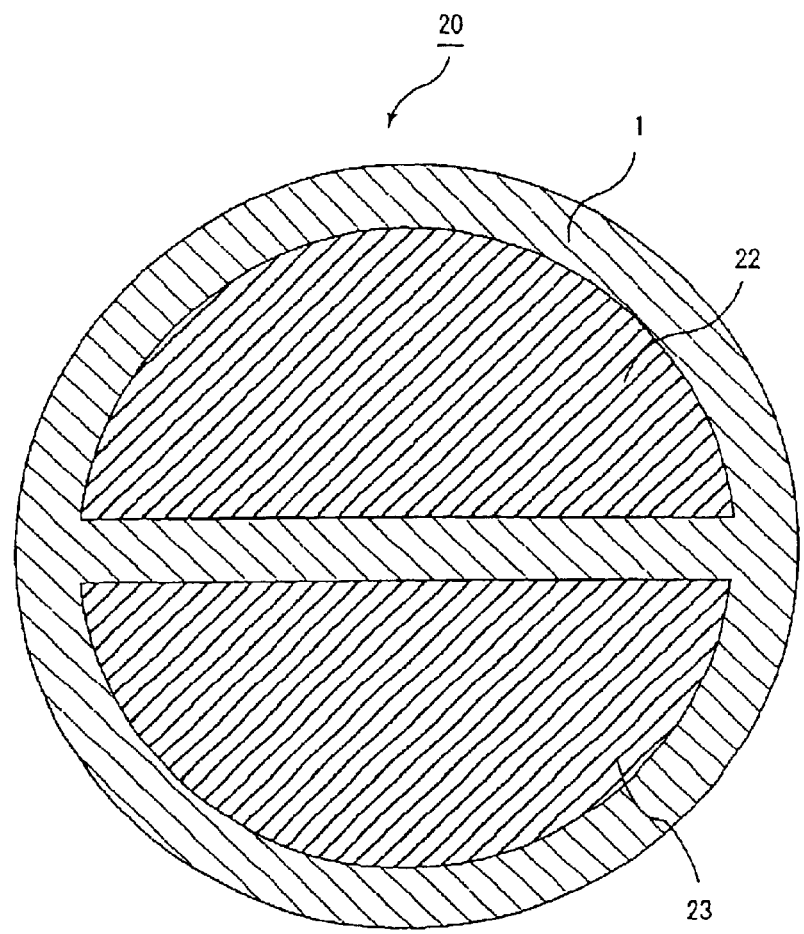
FIG. 9 is a horizontal sectional view that schematically illustrates a shape of an electrostatic electrode constituting an electrostatic chuck according to the present invention.
Figure 10:
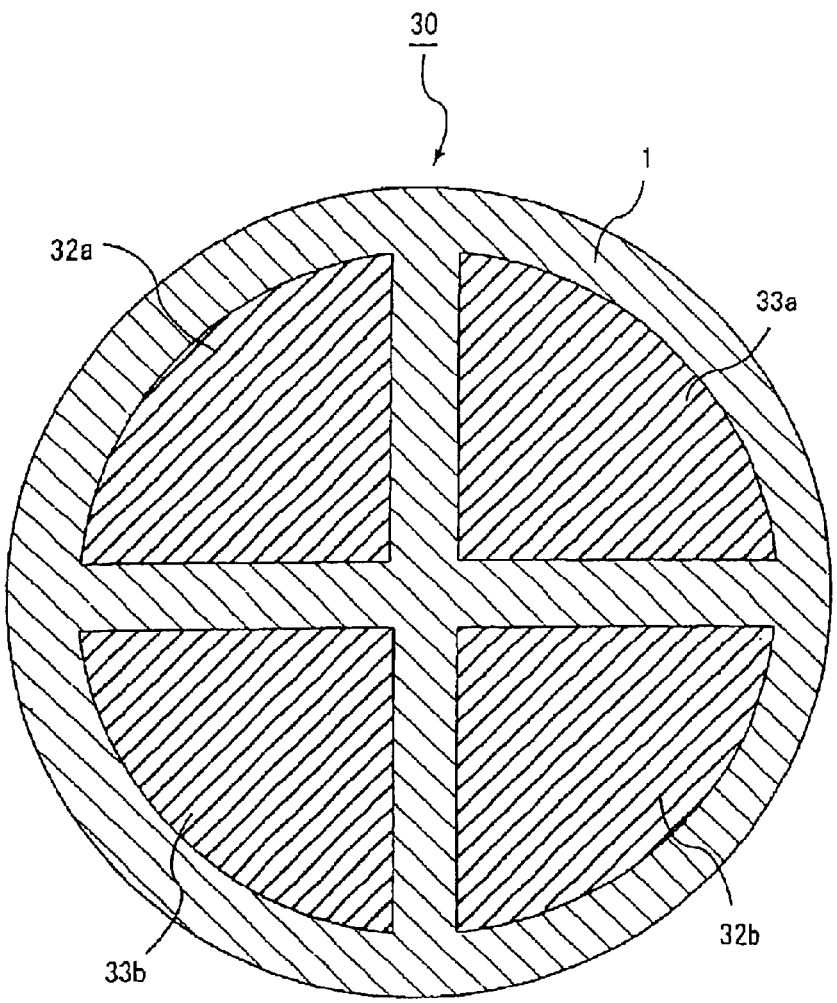
FIG. 10 is a horizontal sectional view that schematically illustrates a shape of an electrostatic electrode constituting an electrostatic chuck according to the present invention.

FIGS. 9 and 10 are horizontal sectional views, each of which schematically shows an electrostatic electrode in other electrostatic chuck. In an electrostatic chuck 20 shown in FIG. 9, a chuck positive electrostatic layer 22 and a chuck negative electrostatic layer 23 in a semicircular form are formed inside a ceramic substrate 1. In an electrostatic chuck shown in FIG. 10, chuck positive electrostatic layers 32a and 32b and chuck negative electrostatic layers 33a and 33b, each of which has a shape obtained by dividing a circle into 4 parts, are formed inside a ceramic substrate 1. The two chuck positive electrostatic layers 22a and 22b and the two chuck negative electrostatic layers 33a and 33b are formed to cross.

A section of the edge of these electrostatic electrodes is also in a peaked shape. An electric field, therefore, concentrates along the edge of the electrostatic electrodes so that a large chuck power is induced. Cracks are not easily generated in the ceramic substrate.

In the case that an electrode having a form that an electrode in the shape of a circle and the like is divided is formed, the number of divided pieces is not particularly limited and may be 5 or more. Its shape is not limited to a fan-shape.

Figure 5:
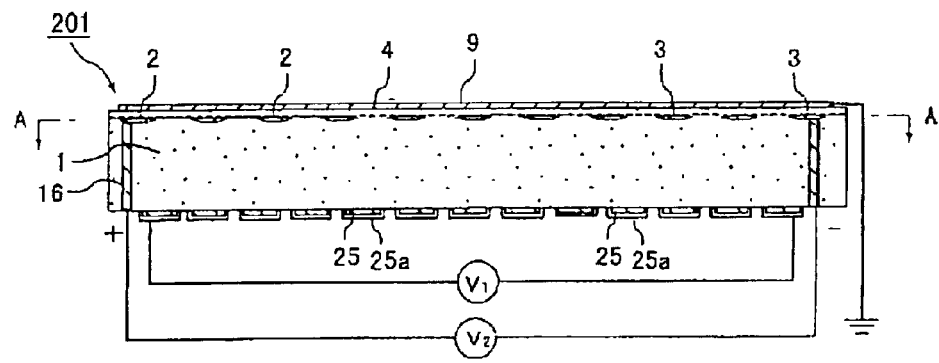
FIG. 5 is a sectional view that schematically illustrates one example of an electrostatic chuck using a ceramic substrate of the present invention.
Figure 6:
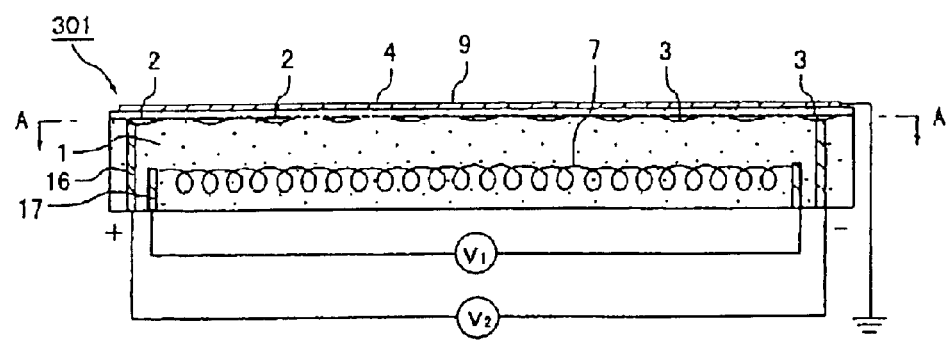
FIG. 6 is a sectional view that schematically illustrates one example of an electrostatic chuck using a ceramic substrate of the present invention.

Examples of the electrostatic chuck in the present invention include the electrostatic chuck 101 having a structure wherein the chuck positive electrostatic layer 2 and the chuck negative electrostatic layer 3 are arranged between the ceramic substrate 1 and the ceramic dielectric film 4 and the resistance heating elements 5 are set up inside the ceramic substrate 1, as shown in FIG. 3; the electrostatic chuck 201 having a structure wherein the chuck positive electrostatic layer 2 and the chuck negative electrostatic layer 3 are arranged between the ceramic substrate 1 and the ceramic dielectric film 4 and the resistance heating elements 25 are disposed on the bottom surface of the ceramic substrate 1, as shown in FIG. 5; the electrostatic chuck 301 having a structure wherein the chuck positive electrostatic layer 2 and the chuck negative electrostatic layer 3 are arranged between the ceramic substrate 1 and the ceramic dielectric film 4 and the metal line 7, which is a resistance heating element, is buried in the ceramic substrate 1, as shown in FIG. 6; and the electrostatic chuck 401 having a structure wherein the chuck positive electrostatic layer 2 and the chuck negative electrostatic layer 3 are arranged between the ceramic substrate 1 and the ceramic dielectric film 4 and the Peltier device 8 composed of the thermoelectric element 81 and the ceramic plate 82 is formed on the bottom surface of the ceramic substrate 1, as shown in FIG. 7.

A section of the edge of the electrostatic electrodes in these electrostatic chucks is in a peaked shape Therefore, a large chuck power is induced. Cracks are not easily generated in the ceramic substrate.

As shown in FIGS. 3 through 7, in the present invention the chuck positive electrostatic layer 2 and the chuck negative electrostatic layer 3 are arranged between the ceramic substrate 1 and the ceramic dielectric film 4 and the resistance heating elements 5 or the metal line 7 is formed inside the ceramic substrate 1. Therefore, connecting units (plated through holes) 16,17 are necessary for connecting these units to external terminals. The plated through holes 16,17 are made by filling with a high melting point metal such as tungsten paste or molybdenum paste, or a conductive ceramic such as tungsten carbide or molybdenum carbide.

The diameter of the connecting units (plated through holes) 16,17 is desirably from 0.1 to 10 mm. This is because disconnection can be prevented and further cracks or strains can be prevented.

The plated through holes are used as connecting pads to connect external terminals 6,18 (see FIG. 8(d)).

The connecting thereof is performed with solder or brazing-filler. As the brazing-filler, brazing silver, brazing palladium, brazing aluminum, or brazing gold is used. Brazing gold is desirably Au—Ni alloy. Au—Ni alloy is superior in adhesiveness to tungsten.

The ratio of Au/Ni is desirably [81.5 to 82.5 (% by weight)]/[18.5 to 17.5 (% by weight)].

The thickness of the Au—Ni layer is desirably from 0.1 to 50 µm. This is because this range is a range sufficient for keeping connection. If Au—Cu alloy is used at a high temperature of 500 to 1000° C. and at a high vacuum of $10^{-6}$ to $10^{-5}$ Pa, the Au—Cu alloy deteriorates. However, Au—Ni alloy does not cause such deterioration and is profitable. When the total amount of the Au—Ni alloy is regarded as 100 parts by weight, the amount of impurities therein is desirably below 1 part by weight.

If necessary, in the present invention a thermocouple may be buried in the bottomed hole in the ceramic substrate. This is because the thermocouple makes it possible to measure the temperature of the resistance heating element and, on the basis of the resultant data, voltage or electric current is changed so that the temperature can be controlled.

The size of the connecting portions of metal lines of the thermocouples is the same as the strand diameter of the respective metal lines or more, and is preferably 0.5 mm or less. Such a structure makes the thermal capacity of the connecting portion small, and causes a temperature to be correctly and speedy converted to a current value. For this reason, temperature control ability is improved so that the temperature distribution of the heated surface of the wafer becomes small.

Examples of the thermocouple include K, R, B, S, E, J and T type thermocouples, described in JIS-C-1602 (1980).

Figure 11:
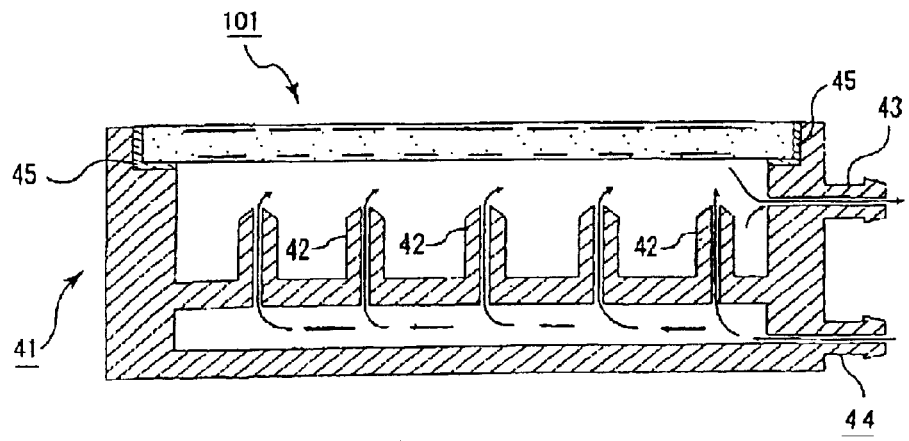
FIG. 11 is a sectional view that schematically illustrates the state that an electrostatic chuck according to the present invention is fitted into a supporting case.

FIG. 11 is a sectional view that schematically shows a supporting case 41 into which the electrostatic chuck of the present invention, having a structure as described above, is fitted.

The electrostatic chuck 101 is fitted into the supporting case 41 through a heat insulator 45. Coolant outlets 42 are made in the supporting case 11, and a coolant is blown from a coolant inlet 44 and passes outside an inhalation duct 43 through the coolant outlet 42. By the action of this coolant, the electrostatic chuck 101 can be cooled.

The following will describe one example of the process for producing an electrostatic chuck as one example of the ceramic substrate of the present invention on the basis of sections shown in FIGS. 8(a) through (d).

(1) First, ceramic powder of a nitride ceramic, a carbide ceramic and the like is mixed with a binder and a solvent to obtain a green sheet 50.

As the ceramic powder, there may be used, for example, oxygen-containing aluminum nitride powder. If necessary, a sintering aid such as alumina or sulfur may be added.

One or several green sheets 50' laminated on the green sheet on which an electrostatic electrode layer printed unit 51 that will be described later is formed are layers which will be a ceramic dielectric film 4; therefore, the sheets 50' may have a composition different from that of the ceramic substrate if necessary.

Usually, the raw material of the ceramic dielectric film 4 and that of the ceramic substrate 1 are desirably the same. This is because these are sintered under the same condition since these are sintered together in many cases. In the case that the raw materials are different, it is allowable that a ceramic substrate is firstly produced, an electrostatic electrode layer is formed thereon and then a ceramic dielectric film is formed thereon.

As the binder, desirable is at least one selected from an acrylic binder, ethylcellulose, butylcellusolve, and polyvinyl alcohol.

As the solvent, desirable is at least one selected from α-terpineol and glycol.

A paste obtained by mixing these is formed into a sheet form by the doctor blade process. Thus, the green sheet 50 is obtained.

If necessary, a through hole into which a support pin of a silicon wafer is inserted, a concave portion in which the thermocouple is buried may be made in the green sheet 50, and further a through hole may be made in a portion where a plated through hole and the like is to be formed. The through hole can be made by punching and the like.

The thickness of the green sheet is preferably from about 0.1 to 5 mm.

Next, a conductor containing paste is filled up into the through holes in the green sheet 50, to obtain plated through hole printed units 53,54. Next, a conductor containing paste that will be electrostatic electrode layers and resistance heating elements is printed on the green sheet 50.

The printing is performed to obtain a desired aspect ratio, considering the shrinkage ratio of the green sheet 50. In this way, electrostatic electrode layer printed units 51 and resistance heating element layer printed units 52 are obtained.

The printed units are formed by printing a conductor containing paste containing conductive ceramic or metal particles, and the like.

As the conductive ceramic particles contained in the conductor containing paste, carbide of tungsten or molybdenum is optimal. This is because they are not easily oxidized and their thermal conductivity is not easily lowered.

As the metal particles, tungsten, molybdenum, platinum, nickel and the like can be used.

The average particle diameters of the conductive ceramic particles and the metal particles are preferably from 0.1 to 5 $\mu$m. This is because the conductor containing paste is not easily printed in either case that these particles are too large or too small.

As such a paste, the following conductor containing paste is optimal: a conductor containing paste prepared by mixing 85 to 97 parts by weight of the metal particles or the conductive ceramic particles; 1.5 to 10 parts by weight of at least one binder selected from acrylic, ethylcellusolve, butylcellusolve and polyvinyl alcohol; 1.5 to 10 parts by weight of at least one solvent selected from α-terpineol, glycol, ethyl alcohol, and butanol.

Next, as shown in FIG. 8(a), the green sheet 50 having the printed units 51, 52, 53 and 54 and the green sheet 50' having no printed units are made into a lamination. The reason why the green sheet 50' having no printed units at the side where the resistance heating elements are formed is deposited is that the following phenomenon is prevented: the end faces of the plated through holes are exposed and the end faces are oxidized at the time of the sintering for the formation of the resistance heating elements. If the sintering for the formation of the resistance heating elements is performed in the state that the end faces of the plated through holes are exposed, it is necessary to sputter a metal which is not easily oxidized, such as nickel. More preferably, the end faces may be covered with brazing gold of Au—Ni.

(2) Next, as shown in FIG. 8(b), the lamination is heated and pressed to form a lamination of the green sheets. The conductor containing paste layer is pressed at this time. Thus, in the case that the formed conductor containing paste layer contains an appropriate binder, a section of the edge thereof turns into a peaked shape. The heating temperature of the lamination is preferably from 50 to 300° C., and the pressure upon the pressing is preferably from 20 to 200 kg/cm$^2$.

Thereafter, the green sheets and the conductor containing paste are sintered.

The temperature at the time of the sintering is preferably from 1000 to 2000° C. and pressure at the time of the sintering is preferably from 100 to 200 kgf/cm$^2$. The heating and the pressing are performed in the atmosphere of inert gas. As the inert gas, argon, nitrogen and the like can be used. In this sintering step, plated through holes 16 and 17, and also the chuck positive electrostatic layer 2, the chuck negative electrostatic layer 3, the resistance heating elements 5, the edge of which is in a peaked shape, and so on can be formed.

(3) Next, as shown in FIG. 8(c), blind holes 35 and 36 for connecting external terminals are made.

It is desirable that at least a part of inside walls of the blind holes 35,36 is made conductive and the conductive part of the inside walls is connected to the chuck positive electrostatic layer 2, the chuck negative electrostatic layer 3, the resistance heating elements 5 and so on.

(4) At last, as shown in FIG. 8(d), external terminals 6 and 18 are fitted into the bottomed holes 35,36 through brazing gold. If necessary, a bottomed hole may be made so that a thermocouple may be buried therein.

As solder, an alloy such as silver-lead, lead-tin or bismuth-tin can be used. The thickness of the solder layer is desirably from 0.1 to 50 $\mu$m. This is because this range is a range sufficient for maintaining the connection based on the solder.

In the above description, the electrostatic chuck 101 (see FIG. 3) is given as an example. In the case that the electrostatic chuck 201 (see FIG. 5) is produced, it is advisable to produce a ceramic plate having an electrostatic electrode layer first, print a conductor containing paste on the bottom surface of this ceramic plate, sinter the resultant, form the resistance heating elements 25 and then form the metal covering layer 25a by electroless plating or the like. In the case that the electrostatic chuck 301 (see FIG. 6) is produced, it is advisable that a metal foil or a metal line is buried, as electrostatic electrodes or resistance heating elements, in ceramic powder and then the resultant is sintered.

In the case that the electrostatic chuck 401 (see FIG. 7) is produced, it is advisable that a ceramic plate having an electrostatic electrode layer is produced and then a Peltier device is jointed to the ceramic plate through a metallized metal layer.

The above-mentioned ceramic substrate functions as a wafer prober in the following case: conductors are arranged on the surface of the ceramic substrate of the present invention and inside the ceramic substrate; the conductor layer on the surface is a chuck top conductor layer; and the inside conductor is either of a guard electrode or a ground electrode.

Figure 12:
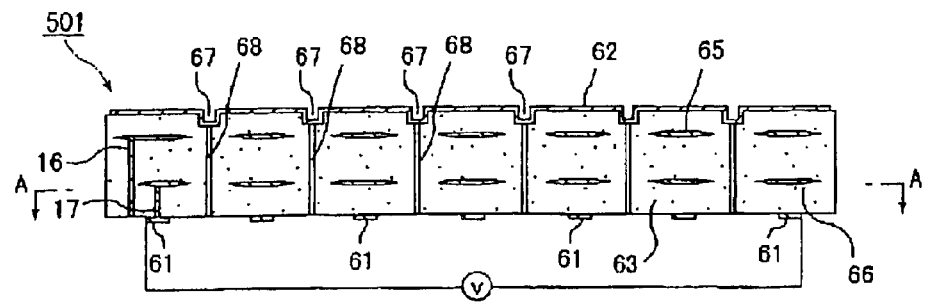
FIG. 12 is a sectional view that schematically illustrates a wafer prober using a ceramic substrate of the present invention.
Figure 13:
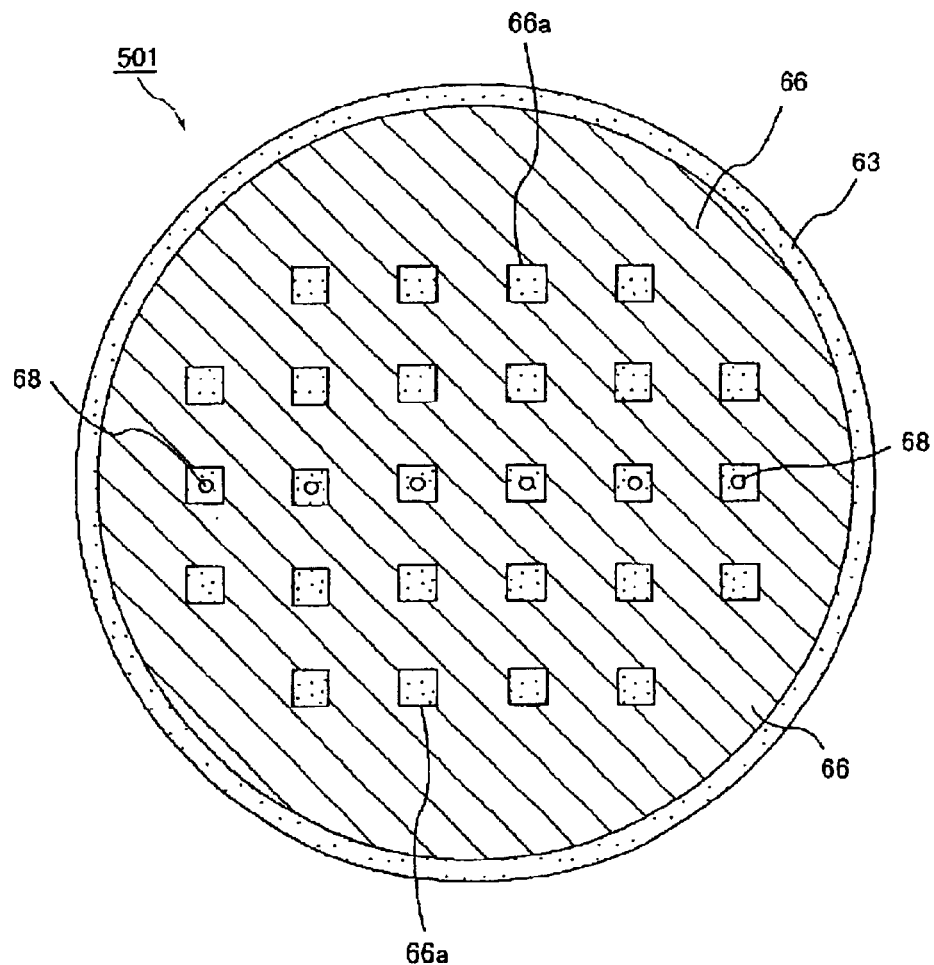
FIG. 13 is a sectional view that schematically illustrates a guard electrode of the wafer prober illustrated in FIG. 12.

FIG. 12 is a sectional view that schematically shows one embodiment of the wafer prober of the present invention. FIG. 13 is a sectional view taken along A—A line in the wafer prober shown in FIG. 12.

In this wafer prober 501, grooves 67, in the form of concentric circles as viewed from the above., are made in the surface of a disc-form ceramic substrate 63. Moreover, suction holes 68 for sucking a silicon wafer are made in a part of the grooves 67. A chuck top conductor layer 62 for connecting electrodes of the silicon wafer is formed, in a circular form, in the greater part of the ceramic plate 63 including the grooves 67.

On the other hand, resistance heating elements 61 as shown in FIG. 1, in the form of concentric circles as viewed from the above, are disposed on the bottom surface of the ceramic substrate 63 to control the temperature of the silicon wafer. External terminals (not illustrated) are connected and fixed to both ends of the resistance heating element 61. Inside the ceramic substrate 63, a guard electrode 65 and a ground electrode 66 (see FIG. 13), in the form of a lattice as viewed from the above, are disposed. Since a section of the edge of the guard electrode 65 and the ground electrode 66 is in a peaked shape, cracks are not easily generated.

In the electrostatic chuck, the resistance heating elements 61 may be set inside the ceramic substrate 63. In this case, if a section of the edge of the resistance heating elements 61 is made into a peaked shape, cracks are not easily generated and a heat-accumulating phenomenon is not easily generated.

The raw material of the guard electrode 65 and the ground electrode 66 may be the same as that of the electrostatic electrode.

The thickness of the chuck top conductor layer 62 is desirably from 1 to 20 μm. If the thickness is below 1 μm, its resistance is too high so as not to function as an electrode. On the other hand, if the thickness is over 20 μm, the layer exfoliates easily by stress that the conductor has.

As the chuck top conductor layer 62, there can be used, for example, at least one metal selected from high melting point metals such as copper, titanium, chromium, nickel, noble metals (gold, silver, platinum and so on), tungsten and molybdenum.

According to the wafer prober having such a structure, a continuity test can be performed by putting a silicon wafer on which integrated circuits are formed, pushing a probe card having tester pins against the silicon wafer, and applying a voltage thereto while heating and cooling the wafer. In the case that a wafer prober is produced, for example, a ceramic substrate wherein resistance heating elements are embedded is firstly produced in the same manner as in the case of the electrostatic chuck. Thereafter, grooves are made on the surface of the ceramic substrate and subsequently the surface in which the grooves are made is subjected to sputtering, plating and so on, to form a metal layer.

BEST MODES FOR CARRYING OUT THE INVENTION

The present invention will be described in more detailed hereinafter.

EXAMPLE 1

Production of an Electrostatic Chuck (See FIG. 3)

(1) The following paste was used to conduct formation by doctor blade method to obtain a green sheet 0.47 μm in thickness: a paste obtained by mixing 100 parts by weight of aluminum nitride powder (made by Tokuyama Corp., average particle diameter: 1.1 μm) 4 parts by weight of yttria (average particle diameter: 0.4 μm), 11.5 parts by weight of an acrylic binder, 0.5 part by weight of a dispersant and 53 parts by weight of mixed alcohols of 1-butanol and ethanol.

(2) Next, this green sheet was dried at 80° C. for 5 hours, and subsequently the following holes were made by punching: holes which would be through holes through which semiconductor wafer supporting pins 1.8 mm, 3.0 mm and 5.0 mm in diameter were inserted; and holes which would be plated through holes for connecting external terminals.

(3) The following were mixed to prepare a conductor containing paste A: 100 parts by weight of tungsten carbide particles having an average particle diameter of 1 μm, 3.0 parts by weight of an acrylic binder, 3.5 parts by weight of α-terpineol solvent, and 0.3 part by weight of a dispersant.

The following were mixed to prepare a conductor containing paste B: 100 parts by weight of tungsten particles having an average particle diameter of 3 μm, 1.9 parts by weight of an acrylic binder, 3.7 parts by weight of α-terpineol solvent, and 0.2 part by weight of a dispersant.

This conductor containing paste A was printed on the green sheet by screen printing to form a conductor containing paste layer. The pattern of the printing was made into a concentric pattern. Furthermore, conductor containing paste layers having an electrostatic electrode pattern shown in FIG. 4 were formed on other green sheets.

Moreover, the conductor containing paste B was filled into the through holes for the plated through holes for connecting external terminals.

Thirty four green sheets 50' on which no tungsten paste was printed were stacked on the upper side (heating surface) of the green sheet 50 that had been subjected to the above-mentioned processing, and the same thirteen green sheets 50' were stacked on the lower side of the green sheet 50. The green sheet 50 on which the conductor containing paste layer having the electrostatic electrode pattern was printed was stacked thereon. Furthermore, two green sheets 50' on which no tungsten paste was printed were stacked thereon. The resultant was pressed at 130° C. and a pressure of 80 kg/cm$^2$ to form a lamination (FIG. 8(*a*)).

(4) Next, the resultant lamination was degreased at 600° C. in the atmosphere of nitrogen gas for 5 hours and hot-pressed at 1890° C. and a pressure of 150 kg/cm$^2$ for 3 hours to obtain an aluminum nitride plate 3 mm in thickness. This was cut off into a disk of 230 mm in diameter to prepare a plate made of aluminum nitride and having therein resistance heating elements 5 having a thickness of 6 μm and a width of 10 μm, a chuck positive electrostatic layer 2 having a thickness of 10 μm, and a chuck negative electrostatic layer 3 having a thickness of 10 μm (FIG. 8(*b*)).

(5) Next, the plate obtained in the (4) was polished with a diamond grindstone. Subsequently a mask was put thereon, and bottomed holes (diameter: 1.2 mm, and depth: 2.0 mm) for thermocouples were made in the surface by blast treatment with SiC and the like.

Figure 8:
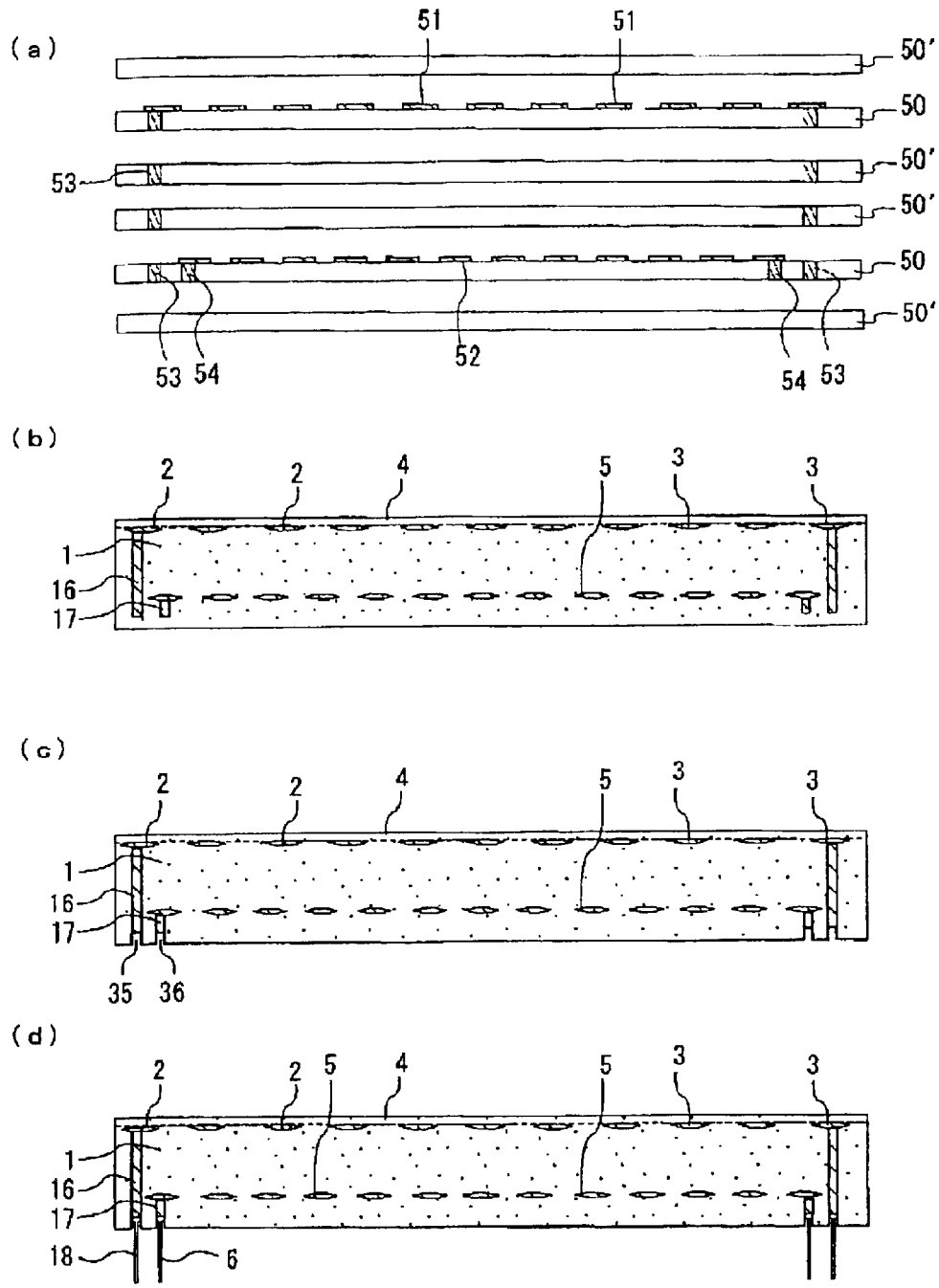
FIGS. 8(a) through (d) are sectional views that schematically illustrate a part of the process for producing the electrostatic chuck illustrated in FIG. 5.

(6) Furthermore, portions corresponding to where the plated through holes were made were hollowed out to make blind holes 35,36 (FIG. 8(*c*)). Brazing gold made of Ni—Au was heated and allowed to reflow at 700° C. to connect external terminals 6, 18 made of Koval to the blind holes 35,36 (FIG. 8(*d*)).

About the connection of the external terminals, a structure, wherein a support of tungsten supports at three points, is desirable. This is because the reliability of the connection can be kept.

(7) Next, thermocouples for controlling temperature were buried in the bottomed holes to finish the production of an electrostatic chuck having the resistance heating elements.

Figure 14:
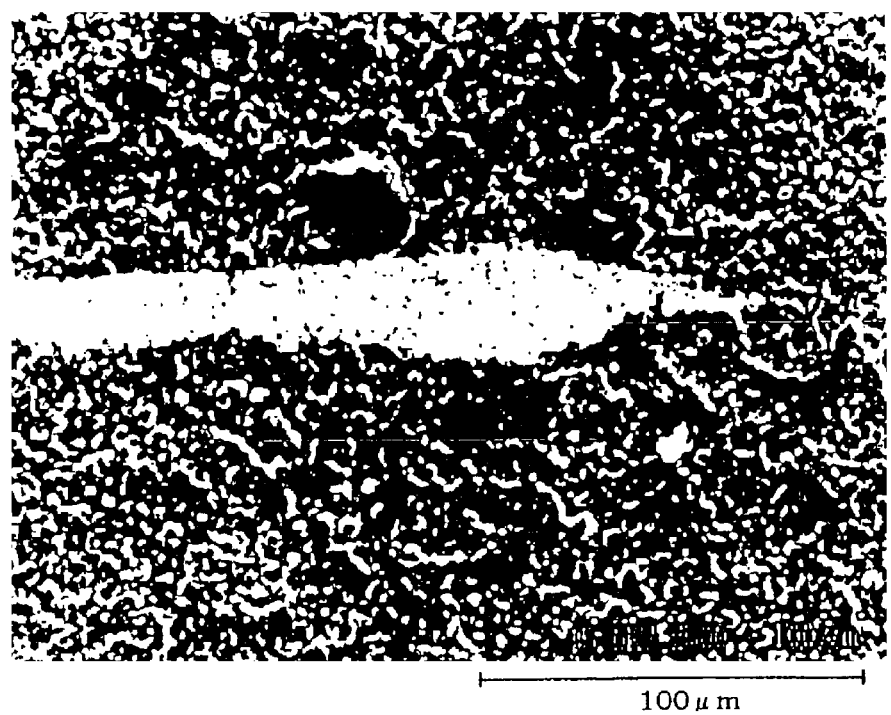
FIG. 14 is an SEM photograph showing a destruction section of a ceramic substrate constituting the electrostatic chuck according to Example 1.

The resultant ceramic substrate constituting the electrostatic chuck was cut in the manner that the cut section would contain the electrostatic electrode layer. The section was observed with a scanning electron microscope (SEM). The results are shown in FIG. 14. As is evident from FIG. 14, the section of the edge of the electrostatic electrode layer was in a peaked shape.

COMPARATIVE EXAMPLE 1

Green sheets were formed to be a lamination in the same manner as in Example 1 except that it was carried out without heating and at the temperature of 25° C. The observation thereof with the scanning electron microscope (500 magnifications) demonstrated that edges of sections of both the electrostatic electrodes and the resistance heating elements had a face perpendicular to the wafer-processing surface.

(EXAMPLE 2)

Production of a Wafer Prober 201 (See FIG. 12)

(1) The following paste was used to conduct formation by doctor blade method to obtain a green sheet 0.47 μm in thickness: a paste obtained by mixing 1000 parts by weight of aluminum nitride powder (made by Tokuyama Corp., average particle diameter: 1.1 μm), 40 parts by weight of yttria (average particle diameter: 0.4 μm), and 530 parts by weight of mixed alcohol's of 1-butanol and ethanol.

(2) Next, this green sheet was dried at 80° C. for 5 hours, and subsequently through holes for plated through holes for connecting external terminals to resistance heating elements were made by punching.

(3) The following were mixed to prepare a conductor containing paste A: 100 parts by weight of tungsten carbide particles having an average particle diameter of 1 μm, 3.0 parts by weight of an acrylic binder, 3.5 parts by weight of α-terpineol solvent, and 0.3 part by weight of a dispersant.

The following were mixed to prepare a conductor containing paste B: 100 parts by weight of tungsten particles having an average particle diameter of 3 μm, 1.9 parts by weight of an acrylic binder, 3. 7 parts by weight of a-terpineol solvent, and 0.2 part by weight of a dispersant.

Next, a printed unit for a guard electrode and a printed unit for a ground electrode in a lattice form were printed on the green sheet by screen sprinting using this conductor containing paste A.

Moreover, the conductor containing paste B was filled into the through holes for the plated through holes for connecting external terminals.

Fifty green sheets on which the paste was printed and no paste was printed were stacked. The resultant was pressed at 130° C. and a pressure of 80 kg/cm² to form a lamination.

(4) Next, this lamination was degreased at 600° C. in the atmosphere of nitrogen gas for 5 hours and hot-pressed at 1890° C. and a pressure of 150 kg/cm² for 3 hours to obtain a aluminum nitride plate 3 mm in thickness. The resultant plate was cut off into a disk of 300 mm in diameter to prepare a ceramic plate. Regarding the size of plated through holes 17, their diameter was 0.2 mm and their depth was 0.2 mm.

The thickness of a guard electrode 65 and a ground electrode 66 was 10 μm. The position where the guard electrode 65 was formed were 1 mm apart from the wafer-putting surface. The position where the ground electrode 66 was formed was 1.2 mm apart from the wafer-putting surface. A section of the edge of the guard electrode 65 and the ground electrode 66 was in a peaked shape. The length of one side of each non-conductor forming area 66a in the guard electrode 65 and the ground electrode 66 was 0.5 mm.

(5) Next, the plate obtained in the (4) was polished with a diamond grindstone. Subsequently a mask was put thereon, and concaves for thermocouples, and grooves 67 (width: 0.5 mm, and depth: 0.5 mm) for adsorbing a wafer were made in the surface by blast treatment with SiC and the like.

(6) Furthermore, a layer for forming resistance heating elements 61 was printed on the surface opposite to the wafer-putting surface. A conductor containing paste was used for the printing. The used conductor containing paste was Solvest PS603D made of Tokuriki Kagaku Kenkyuzyo, which is used to form plated through holes in printed circuit boards. This conductor containing paste was a silver/lead paste, and contained 7.5 parts by weight of metal oxides consisting of lead oxide, zinc oxide, silica, boron oxide and alumina (the weight ratio thereof was 5/55/10/25/5) per 100 parts by weight of silver.

The shape of the silver was scaly and had an average particle diameter of 4.5 μm.

(7) The ceramic substrate 63 on which the conductor containing paste was printed was heated and fired at 780° C. to sinter and bake silver and lead in the conductor containing paste on the ceramic substrate 63. The heater plate was immersed in a bath for electroless nickel plating consisting an aqueous solution containing 30 g/L of nickel sulfate, 30 g/L of boric acid, 30 g/L of ammonium chloride, and 60 g/L of a Rochelle salt, to precipitate a nickel layer (not illustrated) having a thickness of 1 μm and a boron content of 1% or less by weight on the surface of the resistance heating elements 61 made of the sintered silver Thereafter, the heater plate was annealed at 120° C. for 3 hours.

The resistance heating elements made of the sintered silver had a thickness of 5 μm, a width of 2.4 mm and a area resistivity of 7.7 mΩ/□.

(8) By sputtering, a titanium layer, a molybdenum layer and a nickel layer were successively formed on the surface in which the grooves 67 were made. The used equipment for the sputtering was SV-4540 made of ULVAC Japan, Ltd. About conditions for the sputtering, air pressure was 0.6 Pa, temperature was 100° C. and electric power was 200 W. Sputtering time was within the range of 30 seconds to 1 minute, and was adjusted dependently on the respective metals.

About the thickness of the resultant films, an image from a fluorescent X-ray analyzer demonstrated that the thickness of the titanium layer was 0.3 μm, that of the molybdenum layer was 2 μm and that of the nickel layer was 1 μm.

(9) The ceramic substrate 63 obtained in the above (8) was immersed in a bath for electroless nickel plating consisting an aqueous solution containing of 30 g/L of nickel sulfate, 30 g/L of boric acid, 30 g/L of ammonium chloride, and 60 g/L of a Rochelle salt to precipitate a nickel layer having a thickness of 7 μm and a boron content of 1% or less by weight on the surface of the metal layer made by the sputtering. Thereafter, the resultant ceramic substrate was annealed at 120° C. for 3 hours.

No electric current was not allowed to pass on the surface of the resistance heating elements, and the surface was not coated with any electroplating nickel.

The ceramic substrate was immersed in an electroless gold plating solution containing 2 g/L of potassium gold cyanide, 75 g/L of ammonium chloride, 50 g/L of sodium citrate, and 10 g/L of sodium hypophosphite at 93° C. for 1 minute to form a gold plating layer 1 μm in thickness on the nickel plating layer.

(10) Air suction holes 68 piercing the back surface from the grooves 67 were made by drilling, and then blind holes (not illustrated) for exposing plated through holes 16 were made. Brazing gold made of Ni—Au (Au: 81.5% by weight, Ni: 18.4% by weight, and impurities: 0.1% by weight) was heated and allowed to reflow at 970° C. to connect external terminals made of koval to the blind holes. External terminals made of koval were also attached through a solder (tin: 90% by weight, and lead: 10% by weight) on the resistance heating elements.

(11) Next, thermocouples for controlling temperature were buried in the concaves to obtain a wafer prober heater 201.

In the ceramic substrate, its pore diameter of the maximum pore was 2 μm, and its porosity was 1%. The temperature of the ceramic substrate was raised to 200° C. Even if 200 V was applied thereto, no dielectric breakdown was caused. Its warp amount was 1 μm or less, which was good.

COMPARATIVE EXAMPLE 2

Green sheets were formed to be a lamination in the same manner as in Example 2 except that it was carried out without heating and at the temperature of 25° C. The observation thereof with the scanning electron microscope (500 magnifications) demonstrated that edges of sections of both the guard electrode and the ground electrode had a face perpendicular to the wafer-processing surface.

EXAMPLE 3

Alumina Hot Plate (See FIGS. 1 and 2)

(1) The following paste was used to conduct formation by doctor blade method to obtain green sheets 0.47 μm in thickness: a paste obtained by mixing alumina: 93 parts by weight, $SiO_2$: 5 parts by weight, CaO: 0.5 part by weight, MgO: 0.5 part by weight, $TiO_2$: 0.5 part by weight, an acrylic binder: 11.5 parts by weight, 0.5 part by weight of a dispersant and 53 parts by weight of mixed alcohols of 1-butanol and ethanol.

(2) Next, these green sheets were dried at 80° C. for 5 hours, and subsequently the following holes were made in the green sheets for which they are necessary by punching: holes which would be through holes through which semiconductor wafer supporting pins having diameter of 1.8 mm, 3.0 mm and 5.0 mm were inserted; and holes which would be plated through holes for connecting external terminals.

(3) The following were mixed to prepare a conductor containing paste B: 100 parts by weight of tungsten particles having an average particle diameter of 3 μm, 1.9 parts by weight of an acrylic binder, 3.7 parts by weight of α-terpineol solvent, and 0.2 part by weight of a dispersant.

This conductor containing paste B was printed on the green sheet by screen printing to form a conductor containing paste layer. The pattern of the printing was made into a concentric pattern.

(4) Moreover, the conductor containing paste B was filled into the through holes for the plated through holes for connecting external terminals.

Furthermore, 34 to 60 sheets on which no tungsten paste was printed were stacked on the upper surface (heating surface) of the green sheet on which the pattern of the resistance heating elements was formed, and the same 13 to 30 green sheets were stacked on the lower side of the green sheet. This was pressed at 130° C. and a pressure of 80 kg/cm² to form a lamination.

(5) Next, the resultant lamination was degreased at 600° C. in the atmosphere of air for 5 hours and hot-pressed at 1600° C. and a pressure of 150 kg/cm² for 2 hours to obtain an aluminum nitride plate 3 mm in thickness. This was made to a substrate 280 mm in diameter and 19 mm in thickness by changing working conditions and polishing conditions.

A plate which was made of alumina and had therein resistance heating elements 5 having a thickness of 6 μm and a width of 10 mm was prepared. A section of the edge of the resistance heating elements 5 was in a peaked shape.

(6) Next, the plate obtained in the (3) was polished with a diamond grindstone. Subsequently a mask was put thereon, and bottomed holes (diameter: 1.2 mm, and depth: 2.0 mm) for thermocouples were made in the surface by blast treatment with SiC and the like.

(7) Furthermore, portions corresponding to where the plated through holes were made were hollowed out to make blind holes. Brazing gold made of Ni—Au was heated and allowed to reflow at 700° C. to connect external terminals made of koval to the blind holes.

About the connection of the external terminals, a structure, wherein a support of tungsten supports at three points, is desirable. This is because the reliability of the connection can be kept.

(8) Next, thermocouples for controlling temperature were buried in the bottomed holes to finish the production of a hot plate having the resistance heating elements.

COMPARATIVE EXAMPLE 3

Green sheets were formed to be a lamination in the same manner as in Example 3 except that it was carried out without heating and at the temperature of 25° C. The observation thereof with the scanning electron microscope (500 magnifications) demonstrated that edges of sections of the resistance heating elements had a face perpendicular to the wafer-processing surface.

EXAMPLE 4

Hot Plate Made of Aluminum Nitride (See FIGS. 1 and 2)

(1) The following paste was used to conduct formation by doctor blade method to obtain a green sheet 0.47 μm in thickness: a paste obtained by mixing 100 parts by weight of aluminum nitride powder (made by Tokuyama Corp., average particle diameter: 1.1 μm), 4 parts by weight of yttria (average particle diameter: 0.4 μm), 11.5 parts by weight of an acrylic binder, 0.5 part by weight of a dispersant, 8 parts by weight of an acrylic resin binder (made by Kyoeisyha Chemical Co., Ltd., trade name: KC-600, and acid value: 17 KOHmg/g) and 53 parts by weight of mixed alcohols of 1-butanol and ethanol.

(2) Next, this green sheet was dried at 80° C. for 5 hours, and subsequently the following holes were made by punching: holes which would be through holes through which semiconductor wafer supporting pins with a diameter of 1.8 mm, 3.0 mm and 5.0 mm were inserted; and holes which would be plated through holes for connecting external terminals.

(3) The following were mixed to prepare a conductor containing paste A: 100 parts by weight of tungsten carbide particles having an average particle diameter of 1 μm, 3.0 parts by weight of an acrylic binder, 3.5 parts by weight of α-terpineol solvent, and 0.3 part by weight of a dispersant.

The following were mixed to prepare a conductor containing paste B: 100 parts by weight of tungsten particles having an average particle diameter of 3 μm, 1.9 parts by weight of an acrylic binder, 3.7 parts by weight of α-terpineol solvent, and 0.2 part by weight of a dispersant.

This conductor containing paste A was printed on the green sheet by screen printing to form a conductor containing paste layer. The pattern of the printing was made into a concentric pattern. Furthermore, conductor containing paste layers having an electrostatic electrode pattern shown in FIG. 10 were formed on other green sheets.

Moreover, the conductor containing paste B was filled into the through holes for the plated through holes for connecting external terminals.

At 130° C. and a pressure of 80 kg/cm², thirty seven green sheets on which no tungsten paste was printed were stacked on the upper side (heating surface) of the green sheet that had went through the above-mentioned processing, and simultaneously the same thirteen green sheets were stacked on the lower side of the green sheet.

(4) Next, the resultant lamination was degreased at 600° C. in the atmosphere of nitrogen gas for 1 hour and hot-pressed at 1890° C. and a pressure of 150 kg/cm² for 3 hours to obtain an aluminum nitride plate 3 mm in thickness, which contained 810 ppm of carbon. This was cut into a disk of 230 mm in diameter to prepare a plate having therein resistance heating elements having a thickness of 6 μm and a width of 10 mm and electrostatic electrodes. A section of the edge of the electrostatic electrodes was in a peaked shape.

(5) Next, the plate obtained in the (4) was polished with a diamond grindstone. Subsequently a mask was put thereon, and bottomed holes (diameter: 1.2 mm, and depth: 2.0 mm) for thermocouples were made in the surface by blast treatment with SiC and the like.

(6) Furthermore, portions corresponding to where the plated through holes were made were hollowed out to make concaves. Brazing gold made of Ni—Au was heated and allowed to reflow at 700° C. to connect external terminals made of koval to the concaves.

About the connection of the external terminals, a structure, wherein a support of tungsten supports at three points, is desirable. This is because the reliability of the connection can be kept.

(7) Next, thermocouples for controlling temperature were buried in the bottomed holes to finish the production of a ceramic heater (hot plate).

COMPARATIVE EXAMPLE 4

Green sheets were formed to be a lamination in the same manner as in Example 4 except that it was carried out without heating and at the temperature of 25° C. The observation thereof with the scanning electron microscope (500 magnifications) demonstrated that edges of sections of the resistance heating elements had a face perpendicular to the wafer-processing surface.

Evaluation Method (1) Heat Uniformity

A thermo viewer (IR-162012-0012, made by Japan Datum Company) was used to measure temperatures at respective points on the wafer-putting surface of the ceramic substrates to obtain a temperature difference between the highest temperature and the lowest temperature.

(2) Adsorption Power

The temperature of the ceramic substrates was raised to 450° C. to measure the adsorption power thereof with a load cell (Autograph AGS-50, made by Shimadzu Corp.).

(3) Thermal Shock Resistance

The temperature of the ceramic substrates was raised to 200° C. and then the ceramic substrates were thrown into water, and it was examined whether cracks were generated or not. In Table 1, ○ indicates that no crack was generated and the ceramic substrate had thermal shock resistance, and x indicates that cracks were generated and the ceramic substrate had no thermal shock resistance.

(4) Leakage Current

A voltage of 1 kV was applied between conductors that were supposed to be insulated in the ceramic substrates, and then a leakage current at 300° C. was measured using a breakdown voltage tester (TOS-5051, made by Kikusui Electronics Corp.) and an Ultrahigh Resistor (R8340, made by Advantest Corp.).

TABLE 1

| | Heat uniformity (° C.) | Adsorption power (g/cm$^2$) | Thermal shock resistance | Leakage current (mA) |
|---|---|---|---|---|
| Example 1 | 4 | 1000 | ○ | 4 |
| Example 2 | 5 | — | ○ | 3 |
| Example 3 | 10 | — | ○ | 3 |
| Example 4 | 4 | — | ○ | 4 |
| Comparative example 1 | 8 | 800 | X | 8 |
| Comparative example 2 | 10 | — | X | 8 |
| Comparative example 3 | 20 | — | X | 6 |
| Comparative example 4 | 8 | — | X | 9 |

As is clear from Table 1, the ceramic substrates according to Examples 1 to 4 were superior in both heat uniformity and thermal shock resistance. As is also clear from Example 1 and Comparative example 1, the electrostatic chuck according to Example 1 had a large chuck power.

Industrial Applicability

As described above, the ceramic substrate of the present invention is superior in heat uniformity and thermal shock resistance. In the case that the ceramic substrate is used as an electrostatic chuck, its chuck power is large.

What is claimed is:

1. A ceramic heater comprising a ceramic substrate and a conductor layer formed inside said ceramic substrate, wherein
   a section of an edge of the conductor layer has a peaked shape in a cross-section oriented normal to the plane of the conductor layer, and the thickness of the ceramic substrate is 25 mm or less.
2. A hot plate comprising the ceramic heater of claim 1.
3. The ceramic heater of claim 1, wherein the peak shaped section of the edge of the conductor layer has a width of 0.1 to 200 μm.
4. The ceramic heater of claim 1, wherein the peak shaped section of the edge of the conductor layer has a width of 5 to 100 μm.
5. The ceramic heater of claim 1, wherein the peak shaped section of the edge of the conductor layer has a radius of curvature of 0.5 to 500 μm.
6. The ceramic heater of claim 1, wherein the ceramic substrate has porosity of 5% or less.
7. The ceramic heater of claim 1, wherein the ceramic substrate has a maximum pore diameter of 50 μm or less.
8. The ceramic heater of claim 1, wherein the ceramic substrate comprises at least one ceramic selected from the group consisting of nitride ceramics, carbide ceramics, oxide ceramics, and mixtures thereof.
9. The ceramic heater of claim 8, wherein the ceramic substrate comprises at least one nitride ceramic selected from the group consisting of aluminum nitride, silicon nitride, boron nitride, and mixtures thereof.
10. The ceramic heater of claim 8, wherein the ceramic substrate comprises at least one carbide ceramic selected from the group consisting of silicon carbide, zirconium carbide, tantalum carbide, tungsten carbide, and mixtures thereof.
11. The ceramic heater of claim 8, wherein the ceramic substrate comprises at least one oxide ceramic selected from the group consisting of alumina, zirconia, cordiente, mullite, and mixtures thereof.
12. The ceramic heater of claim 8, wherein the ceramic substrate further comprises 0.1 to 5% by weight of oxygen.

13. The ceramic heater of claim 12, wherein the ceramic substrate further comprises at least one of yttria, alumina, rubidium oxide, lithium oxide, and calcium oxide.

14. The ceramic heater of claim 8, wherein the ceramic substrate further comprises 5 to 5000 ppm of carbon.

15. A process for making a ceramic heater, the process comprising sintering a laminate comprising a conductor layer between a first ceramic green sheet and at least one additional ceramic green sheet; and producing the ceramic heater of claim 1.

* * * * *